(12) United States Patent
Eri

(10) Patent No.: US 8,040,348 B2
(45) Date of Patent: Oct. 18, 2011

(54) COMBINED SECTIONAL VIEW PRODUCING METHOD AND APPARATUS

(75) Inventor: Ryusuke Eri, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 917 days.

(21) Appl. No.: 11/881,419

(22) Filed: Jul. 27, 2007

(65) Prior Publication Data

US 2008/0059879 A1 Mar. 6, 2008

(30) Foreign Application Priority Data

Jul. 28, 2006 (JP) ................................. 2006-206811

(51) Int. Cl.
*G09G 5/00* (2006.01)
*G06T 15/00* (2011.01)
*G06T 15/40* (2011.01)
(52) U.S. Cl. ......... 345/421; 345/419; 345/630; 345/629
(58) Field of Classification Search .................. 345/419, 345/629, 420, 421, 630
See application file for complete search history.

(56) References Cited

U.S. PATENT DOCUMENTS 5,701,403 A * 12/1997 Watanabe et al. ............. 345/419
2002/0180728 A1 * 12/2002 Neff et al. ..................... 345/419
2003/0210244 A1 * 11/2003 Sasago et al. ................. 345/419
2004/0051710 A1 * 3/2004 Hara ............................. 345/419

FOREIGN PATENT DOCUMENTS

JP 05-303612 11/1993
JP 07-110872 4/1995

\* cited by examiner

*Primary Examiner* — Chante Harrison
(74) *Attorney, Agent, or Firm* — Greer, Burns & Crain, Ltd.

(57) ABSTRACT

A combined sectional view is produced by obtaining a section plane based on one of a plurality of section lines, which is currently set as a target, and on a cut face along the target section line, obtaining an adjacent section plane passing a crossed point between a connected section line, which is connected to the target section line, and the target section line and being perpendicular to a plane including the plurality of section lines and to the section plane, specifying one or more elements and/or parts of elements of a three-dimensional model, which are necessary to draw a sectional view of the model, with respect to the section plane and the adjacent section plane, projecting the specified elements and/or the parts of the elements to obtain a sectional view corresponding to the target section line, and combining a plurality of sectional views obtained by executing the above-described processes for each of the section lines.

10 Claims, 27 Drawing Sheets

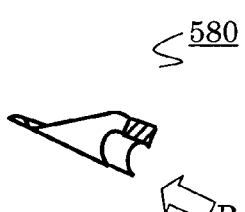
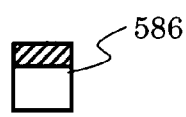
Fig. 22A    Fig. 22D
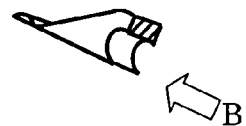
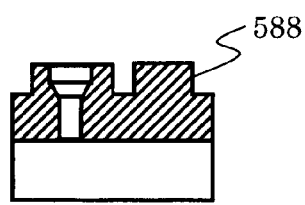
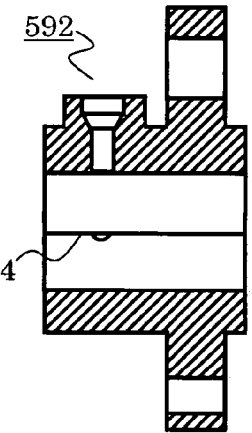
Fig. 22B    Fig. 22E
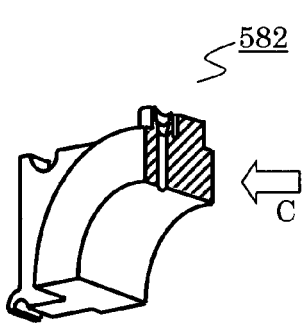
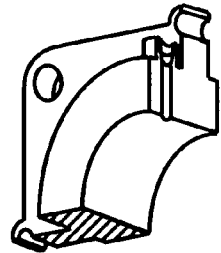
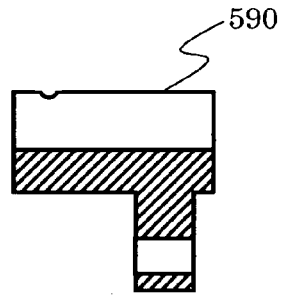
Fig. 22G
Fig. 22C    Fig. 22F

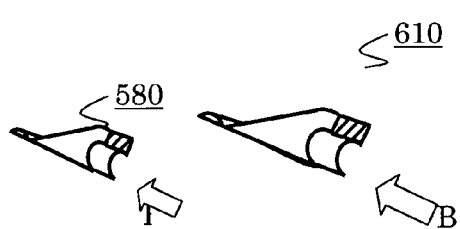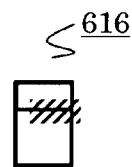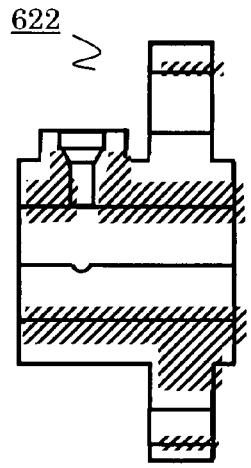
Fig. 24A    Fig. 24D    Fig. 24G
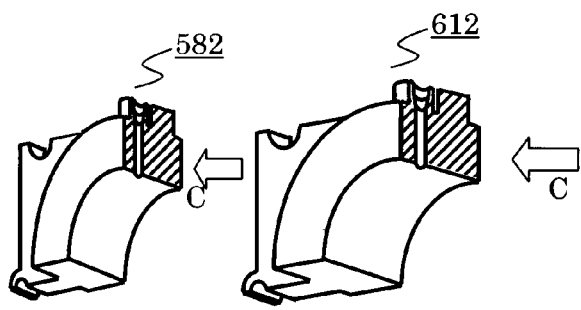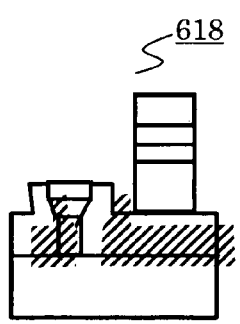
Fig. 24B    Fig. 24E    Fig. 24H
Fig. 24J
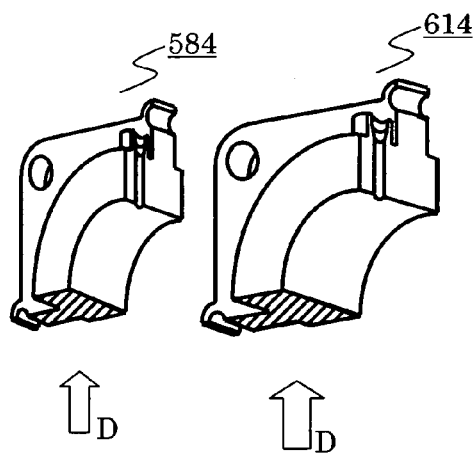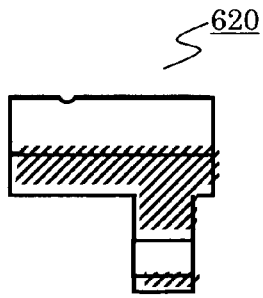
Fig. 24C    Fig. 24F    Fig. 24I

US 8,040,348 B2

COMBINED SECTIONAL VIEW PRODUCING METHOD AND APPARATUS

BACKGROUND OF THE INVENTION

1. Field of the Invention

The present invention relates to a method for drawing a sectional view of an object, and more specifically, to a method for drawing a sectional view taken along a plurality of section planes.

2. Description of the Related Art

In general drawings for mechanical design, an interior shape of an object is often represented using hidden lines such as dashed lines. When drawing a complicated shape, however, many hidden lines are used and the drawing becomes hard to understand. FIG. 18A shows a part 500 having the shape of a cylinder 504 having a flange 502, the cylinder 504 formed to extend in a direction toward a person viewing the drawing with a cylindrical hollow 506 coaxially formed in the cylinder 504. Although many dashed lines shown the hidden lines are used to show the shape of the hollowed portion, the presence of many hidden lines makes it rather difficult to grasp the shape of the part.

In such a case, a technique of imaginary cutting an object along a section plane, removing a cut portion positioned closer to the person viewing the drawing, and depicting the remaining portion is practiced so that an interior shape of the object to be shown is illustrated in an easily recognizable manner (see FIG. 18B). A figure drawn by that technique is called a sectional view. FIG. 18B is a sectional view resulting from cutting the part of FIG. 18A along a vertical plane passing a center axis of the part 500. In FIG. 18B, hatching with parallel slant lines indicates a section 506 and a two-dot-chain lines 510 indicates an exterior shape of the cut-away portion of the part 500.

There are several types of methods for drawing a sectional view. According to one of the methods, sectional views taken along two or more section planes are combined into one. The resulting view is called a "sectional view by combination" (hereinafter referred to as a "combined sectional view"). The combined sectional view can be further classified into several types. One of those types represents the "case of cutting an object along two crossed planes."

The "case of cutting an object along two crossed planes" corresponds to the case that, when an object has a symmetrical or nearly symmetrical shape and portions to be shown in a sectional view are not present on one plane, the object can be cut along a section plane above a certain center line (e.g., a center line of symmetry) and a section plane below it at a certain angle between the two section planes. A sectioned model of FIG. 19A is obtained by cutting a part 520 which has a flange 522, a cylinder 524 with a hollow 528 and a projecting portion 562, shown in a front view of FIG. 19B, along a section plane corresponding to a section line indicated by a segment OA and a section plane corresponding to a section line indicated by a segment OB. A sectional view 530 of FIG. 19C is obtained by projecting the sectioned model onto a projection plane parallel to the section plane corresponding to the section line OA or the section plane corresponding to the section line OB.

Depicting sectional views resulting from cutting an object along two crossed planes in a combined manner is advantageous in reducing the number of orthographic views to be depicted as drawings and in realizing a reduction of a drawing space.

Stated another way, two-dimensional drawings are premised on printing on a sheet of paper having a prescribed size, and they can be depicted on the sheet of paper having the prescribed size by combining plural drawings into one.

In the case of cutting an object along two crossed planes, the object is generally cut along two planes. Such a case is already adaptively dealt with in some of famous CAD (Computer Aided Design) systems. Example of those systems is SolidWorks (registered trade name).

In that type of sectional view, it is further possible to depict sectional views resulting from cutting an object along two crossed planes in combination with other sectional views. Such a combination is called the "case of complicated section planes" by JIS Handbook Drawing (Japanese Standards Association, 1995) and, in this specification, it is referred to as a combined sectional view cutting an object along crossed plural planes. For understanding of the "case of complicated section planes," reference is made to FIGS. 20A to 20C. A sectioned model 562 of FIG. 20A is obtained by cutting a part 550, shown in a front view of FIG. 20B, along a section plane corresponding to a section line indicated by a segment OA, a section plane corresponding to a section line indicated by a segment OB, a section plane indicated by a curved line BC, and a section plane indicated by a segment CD. A sectional view 564 of FIG. 20C is obtained by projecting the sectioned model 562 onto planes parallel to the section planes indicated by the respective segments OA, OB and CD, and combining the projected views. The sectional view 564 of FIG. 20C is obtained by an engineer imaging the various sections in accordance with the drawing techniques.

However, the known system can not draw a combined sectional view cutting an object along crossed plural planes. The user is therefore required to draw such a combined sectional view with any of the following techniques by utilizing the functions already provided by the known system:

Combine detailed views (FIG. 21)

Form a plurality of sectioned models and combine respective sectional views of the sectioned models (FIG. 22)

Those techniques will be described below with reference to the drawings.

FIG. 21A shows the same sectioned model 562 as shown in FIG. 20A, and the arrows B, C, and D show each viewing direction of corresponding sectional view. FIG. 21B is a projected view obtained by projecting the sectioned model onto a plane parallel to the section plane corresponding to the section line CD, FIG. 21C is a projected view obtained by projecting the sectioned model onto a plane parallel to the section plane corresponding to the section line OB, and FIG. 21D is a projected view obtained by projecting the sectioned model onto a plane parallel to the section plane corresponding to the section line AO, where each section line is shown in FIG. 20B. In FIGS. 21B through 21D, hatched areas represent cut faces provided by the respective section planes. FIG. 21A can be produced by the user designating the respective section planes on the part model 562 of FIG. 20B. FIGS. 21B through 21D can be each produced by designating a plane parallel to the corresponding cut face and projecting the sectioned model onto the plane (designation of the projection). From those figures, the sectional view same one of FIG. 20C is obtained as follows. The user designates the cut faces corresponding to FIGS. 21B through 21D by specifying rectangular areas indicated by dotted lines and then manually designates relative positional relationships among resulting sectional views (designation of projecting positions), thereby producing a sectional view of FIG. 21E. Comparing with FIG. 20C, an unnecessary segment is depicted in a hollow region of the part 550 (see FIG. 20B) because view ranges indicated by dotted lines in FIGS. 21C and 21D are just combined with each other. A sectional view similar to that of FIG. 20C is obtained by manually removing the unnecessary segment.

FIGS. 22A through 22C show sectioned models which are obtained by manually removing, from the sectioned model 562 of FIG. 20A, portions unnecessary for the respective sectional views, so that the sectional view of FIG. 20C is obtained. The sectional views 586, 588, and 590 of FIGS. 22D through 22F are projected views which are produced by projecting the sectioned models 580, 582, and 584 of FIGS. 22A through 22C onto planes parallel to the respective section planes (designation of the projection). A sectional view 592 of FIG. 22G is obtained by manually designating relative positional relationships among the sectional views of FIGS. 22D through 22F (designation of projecting positions). FIG. 22G also includes an unnecessary segment 594 as in FIG. 21E. Hence the sectional view of FIG. 20C is obtained by removing the unnecessary segment through a similar manual operation.

Using the above-described techniques gives rise to the following problems. The problems with those techniques will be described below.

[Case of Combining Detailed Views]

A larger number of operations have to be made by the user for design work because of the necessity of combining a plurality of detailed views with each other and performing the "designation of the projection" and the "designation of the projecting position" for each combination of the detailed views.

A higher degree of freedom in operations made by the user in preparation of the detailed views leads to a possibility that an incorrect sectional view may be produced. A finally obtained sectional view should be free from individual differences if many steps of operations have to be made by the user just in a procedural point of view. In fact, however, the user is required to perform the operations while imaging the finally obtained sectional view and an incorrect sectional view is apt to be produced.

When the shape of the model is updated, an operation of readjusting respective view ranges for the detailed views is required. More specifically, when the user performs an operation of magnifying a sectioned model 562 of FIG. 23A to a sectioned model 596 of FIG. 23B, the detailed views are also magnified correspondingly from FIGS. 21B through 21D to FIGS. 23C through 23E. On the other hand, each of rectangular areas 598, 600, and 602 designated by the user remains the same. This means that the cut face of the sectioned model is enlarged beyond the rectangular areas 598, 600, and 602 set as the view ranges for the detailed view, and that the mutual positional relationships among the detailed views have also to be readjusted depending on the enlargement of the sectioned models. If the positional relationships among the detailed views are left not readjusted, a sectional view 604 lacking continuity is finally produced as shown in FIG. 23F.

Because an unnecessary linear line is drawn in the combined boundary between the sectional views as described above, the operation of deleting such an element of the unnecessary linear line is required, thus resulting in need of increased time and labor (see the unnecessary linear line 678 of FIG. 25).

[Case of Forming Plural Sectioned Models and Combine Respective Sectional Views of Sectioned Models]

A larger number of operations have to be made by the user for design work because of the necessity of combining a plurality of sectional views with each other and performing the "designation of the projection" and the "designation of the projecting position" for each combination of the sectional views.

The sectioned models resulting from removing unnecessary portions with respective plane surfaces of the section planes viewed from the front (e.g., three models of FIGS. 22A, 22B and 22C) are required in addition to the original sectioned model. Also, a higher degree of freedom in operations made by the user in preparation of the sectional views leads to a possibility that an incorrect sectional view may be produced.

When the shape of the model is updated, operations such as readjusting respective positions of the sectional views, deleting projected portions of unnecessary shapes, and changing the hatched areas are required. More specifically, referring to FIG. 24, when sectioned models 580, 582, and 584 of FIGS. 24A through 24C are magnified to sectioned models 610, 612, and 614 of FIGS. 24D through 24F, a sectional view lacking continuity is finally produced as shown in FIG. 24J unless the mutual positional relationships among sectional views of FIGS. 24G through 24I are readjusted.

Because an unnecessary linear line is drawn in the combined boundary between the sectional views as described above as shown in FIG. 25E, the operation of deleting such an element of the unnecessary linear line is required, thus resulting in need of increased time and labor.

SUMMARY OF THE INVENTION

With the view of solving the problems mentioned above, an object of the present invention is to provide a combined sectional view producing apparatus which can reduce manual setting operations to be performed by a user in initial setup and can omit the necessity of manual re-setting when a shape of a sectioned model is changed, thus increasing convenience for the user.

The present invention provides the function of automatically combining a plurality of projected views using one sectioned model, which are obtained by deleting unnecessary portions from the sectioned model, and of drawing a sectional view (complex combined sectional view) in which each section plane specified by the user is directed to the front.

Also, the present invention provides the function of automatically re-forming (re-projecting) a two-dimensional drawing in response to change of the model shape.

(1) A combined sectional view producing method according to the present invention comprises the steps of searching for a connected section line, which is connected to a target section line, from a plurality of section lines received from a user; obtaining a crossed point between the searched connected section line and the target section line; obtaining a section plane which passes the section line and has the same normal line vector as a normal line vector of a cut face; obtaining an adjacent section plane which is perpendicular to a plane including the plurality of section lines and to the obtained section plane and which passes the obtained crossed point between the connected section line and the target section line; obtaining a viewing direction of the target section line, which is reversal to the normal line vector of the section plane corresponding to the target section line; specifying an element and/or a part of an element of a three-dimensional model, which can be seen with a viewing direction set to the viewing direction of the target section line; specifying an element and/or a part of an element of the three-dimensional model, which is positioned on the side of the section plane opposed to the normal line vector thereof, including the plane itself; specifying an element and/or a part of an element of the three-dimensional model, which is positioned on the side of the adjacent section plane opposed to the normal line vector thereof, projecting the elements and/or the parts of the elements which have been specified with respect to visibility in the viewing direction of the target section line, the section plane, and the adjacent section plane, thereby obtaining a sectional view to be combined; and combining a plurality of sectional views to be combined, thereby producing a combined sectional view.

Thus, according to the present invention, the combined sectional view is produced by obtaining a section plane based on one of a plurality of section lines, which is currently set as a target, and on a cut face along the target section line, obtaining an adjacent section plane passing a crossed point between a connected section line, which is connected to the target section line, and the target section line and being perpendicular to a plane including the plurality of section lines (the plane capable of being also called a plane on which the section lines are drawn) and to the section plane, specifying one or more elements and/or parts of elements of a three-dimensional model, which are necessary to draw a sectional view of the model, with respect to the section plane and the adjacent section plane, projecting the specified elements and/or the parts of the elements to obtain a sectional view corresponding to the target section line, and combining a plurality of sectional views obtained by executing the above-described processes for each of the section lines. Therefore, advantages are obtained in that the user is just required to designate the section lines, that even when a shape of the three-dimensional model is changed, the combined sectional view can be produced in an automatically adapted manner, and that convenience of the user is greatly improved. Also, a reduction of the designating operations made by the user means a higher possibility that the same combined sectional view is produced regardless of skill of the user. In other words, errors caused in the human operations can be suppressed.

The "step of specifying an element and/or a part of an element, which can be seen with a viewing direction set to the viewing direction of the target section line" means a process of excluding an element, which cannot be seen on the sectional view, from the projected elements and/or parts of the elements. In other words, specifying a visible element and/or part of an element is equivalent to specifying an invisible element and/or part of an element. Therefore, the visible element and/or part of the element can be specified by deleting the invisible element and/or part of the element.

The "step of specifying an element and/or a part of an element of a specified three-dimensional model, which can be seen with a viewing direction set to the viewing direction of the target section line" can also specify an element and/or a part of an element which cannot be seen in the viewing direction (i.e., invisible element information). Further, the invisible element information can also be made visible. Accordingly, a method including at least the process of determining whether an element and/or a part of an element is visible or invisible is involved in the present invention.

(2) [Coping with Case Where Cut Face is Concealed by Other Element]

A combined sectional view producing method according to the present invention comprises the steps of searching for a connected section line, which is connected to a target section line, from a plurality of section lines; obtaining a crossed point between the searched connected section line and the target section line; obtaining a section plane which passes the section line and has the same normal line vector as a normal line vector of a cut face; obtaining an adjacent section plane which is perpendicular to a plane including the plurality of section lines and to the obtained section plane and which passes the obtained crossed point between the connected section line and the target section line; obtaining a viewing direction of the target section line, which is reversal to the normal line vector of the section plane corresponding to the target section line; specifying an element and/or a part of an element of a three-dimensional model, which is positioned on the side of the section plane opposed to the normal line vector thereof, including the plane itself; specifying an element and/or a part of an element which belongs to a portion of the three-dimensional model on the side of the section plane opposed to the normal line vector thereof and which can be seen with a viewing direction set to the viewing direction of the target section line; specifying one or more of the elements and/or the parts of the elements of the three-dimensional model capable of being seen with the viewing direction set to the viewing direction of the target section line, which are positioned on the side of the adjacent section plane opposed to a normal line vector thereof; projecting the one or more elements and/or parts of the elements which have been specified with respect to the adjacent section plane, thereby obtaining a sectional view to be combined; and combining a plurality of sectional views to be combined, thereby producing a combined sectional view.

Thus, according to the present invention, an element and/or a part of an element of a three-dimensional model, which is positioned on the side of the section plane opposed to the normal line vector thereof, including the plane itself, is specified prior to specifying an element and/or a part of an element which belongs to a portion of the three-dimensional model on the side of the section plane opposed to the normal line vector thereof and which can be seen with a viewing direction set to the viewing direction of the target section line. Therefore, an advantage is obtained in that the cut face or a part of the cut face is avoided from being excluded from the target of processing and from being not projected for the reason that the cut face is concealed by a visible element.

(3) [Removal of Unnecessary Element in Combined Sectional View]

In the combined sectional view producing method according to the present invention, as an occasion requires, the step of specifying an element and/or a part of an element, which is positioned on the side of the adjacent section plane opposed to the normal line vector thereof, specifies the element and/or the part of the element without including the plane itself.

Thus, according to the present invention, among the elements and/or the parts of the elements of the three-dimensional model, one or more elements and/or parts of elements are specified which are positioned on the side of the adjacent section plane opposed to the normal line vector thereof without including the plane itself. When the elements and/or the parts of the elements are specified including those ones positioned on the adjacent section plane itself, there is a possibility that an unnecessary element is also displayed at the boundary between the sectional views corresponding to the section lines. However, such an unnecessary element can be avoided from being displayed. On the other hand, the wording "including the (section) plane itself" in "the step of specifying an element and/or a part of an element of the three-dimensional model, which is positioned on the side of the section plane opposed to the normal line vector thereof, including the plane itself" is intended to prevent a possibility that an element cut by the section plane is removed when the element and/or the part of the element is specified without including the section plane itself.

(4) [Avoidance of Unnecessary Processing Related to Section Line not Subjected to Target]

The combined sectional view producing method further comprises, as an occasion requires, the step of determining whether the section line received from the user to specify the cut face is a linear line, wherein if the section line is not a linear line, the processing related to the relevant section line is not executed.

Thus, according to the present invention, it is determined whether the section line received from the user to specify the cut face is a linear line, and if the section line is not a linear line (for example, if it is a circular arc), the processing related to the relevant section line is excluded from the target. Therefore, an advantage is obtained in that the section line to be handled as the processing target can be limited to a linear line and useless processing can be avoided from being executed. For example, the section plane corresponding to a cylindrical surface, which is indicated by a circular arc, is excluded from the processing target. That excluding process is preferably executed immediately after the section line is taken out as the target of processing from the plurality of section lines from the viewpoint of not executing the useless processing. It is also possible to execute, regardless of the practical necessity, the processing for the section line in the form of a circular arc to obtain a sectional view to be combined, to specify those ones from among all the sectional views to be combined, which are necessary to obtain the combined sectional view, and to combine the specified sectional views to be combined. However, when any of the sectional views to be combined is not specified for the use, the processing executed to obtain the relevant sectional view is wasteful.

(5) [More Suitable Production of Combined Sectional View]

In the combined sectional view producing method, as an occasion requires, the step of combining the sectional views to be combined, thereby producing a combined sectional view, produces the combined sectional view by combining the sectional views on the basis of a crossed axis between the section planes.

Thus, according to the present invention, since the combined sectional view is produced by combining the sectional views, which are to be combined, on the basis of a crossed axis between the section planes, an advantage is obtained in that the sectional views obtained corresponding to the section lines by performing respective projections onto different projection planes can be drawn with the projections made onto the same plane while holding an aligned relation between the sectional views. When an overlap is caused as a result of the projections, one sectional view is preferably translated on the same plane so that the overlap is eliminated. Note that because a method of detecting whether elements are overlapped on a two-dimensional plane can be realized with known and conventional techniques, a detailed description of the method is omitted here.

(6) [More Suitable Production of Combined Sectional View]

The combined sectional view producing method according further comprises, as an occasion requires, the steps of obtaining an angle formed between a viewing direction of a sectional view received from the user and the viewing direction of the target section line; and obtaining a viewing up-direction of the target section line from a viewing up-direction of the sectional view received from the user and the obtained angle formed between the viewing direction of the sectional view and the viewing direction of the target section line, wherein the step of projecting the elements and/or the parts of the elements which have been specified with respect to visibility in the viewing direction of the target section line, the section plane, and the adjacent section plane, thereby obtaining a sectional view to be combined, is further included and executed using, as a projection plane, a plane which is specified by the viewing direction and the viewing up-direction of the target section line.

Thus, according to the present invention, in addition to the viewing direction of the target section line, the viewing up-direction of the target section line is also obtained from the viewing direction of the sectional view received from the user and the viewing up-direction of the sectional view, and the projection is performed onto a projection plane defined by the viewing direction and the viewing up-direction of the target section line. Therefore, an advantage is obtained in providing the sectional views to be combined, which are mutually definite in their directions.

(7) [Color for Each of Sectional Views to be Combined]

In the combined sectional view producing method, as an occasion requires, the elements and/or the parts of the elements in the produced combined sectional view are colored in different colors for each of the sectional views to be combined.

Thus, according to the present invention, since the elements in the produced combined sectional view are colored in different colors for each of the sectional views to be combined, an advantage is obtained in that the user can recognize the elements of the sectional views to be combined in a discernable manner per sectional view. Such color allocation ensures higher visual recognition than the case where boundary lines between the sectional views to be combined are indicated just using, e.g., dotted lines in a discernable manner.

In embodiments described later, each face cut along the section plane is indicated by hatching.

(8) [Color Corresponding to Section Plane for Each of Sectional Views to be Combined]

In the combined sectional view producing method, as an occasion requires, the different colors allocated to the respective sectional views to be combined differ from each other depending on colors set related to the corresponding section lines and/or section planes.

Thus, according to the present invention, since a different color is allocated to the elements depending on not only each of the sectional views to be combined, but also the corresponding section line and/or section plane, an advantage is obtained in that the user can visually recognize the correspondence between a group of elements in each of the sectional views to be combined and the corresponding section line or section plane.

For example, a color of the elements in each of the sectional views to be combined is set to be the same as that of the corresponding section line and/or section plane.

The colors set related to the section lines or the section planes are received from the user in some cases or automatically allocated by the apparatus in other cases.

When three-dimensional models (sectioned models) corresponding to the respective section lines immediately prior to the projection are three-dimensionally displayed, the sectioned models may be colored in different colors for each of the section lines.

Throughout (1) to (8)), the steps are each executed by a computer including at least a memory and a processor. A unit for executing the operation is the processor or the computer.

The cut face is a face that can be viewed by cutting the three-dimensional model along the section plane. The elements are faces, lines, points, etc. that constitute the three-dimensional model. The part of the element means a portion of element, i.e., a part of the face and a part of the line.

A combined sectional view producing apparatus can be constructed as an independent single unit or incorporated so as to perform one function of a computer aided design (CAD) apparatus. It operates to receive three-dimensional CAD data from the CAD apparatus and to send out combined drawing data to the CAD apparatus.

Also, the present invention can be implemented as not only a method, but also a combined sectional view producing apparatus and a combined sectional view producing program, i.e., as an apparatus and a program.

The foregoing summary of the present invention should not be construed as listing up all features essential in the present invention, and sub-combinations of plural ones of the above-described features are also involved in the scope of the invention.

BRIEF DESCRIPTION OF THE DRAWINGS

FIGS. 22A to 22G show sectional views obtained by combining views projected in a plurality of cutting directions;

FIGS. 24A to 24J are explanatory views for explaining a problem with a sectional view produced by combining a plurality of views projected in a plurality of cutting directions (when model is magnified);

DESCRIPTION OF THE PREFERRED EMBODIMENTS

Figure 1A:
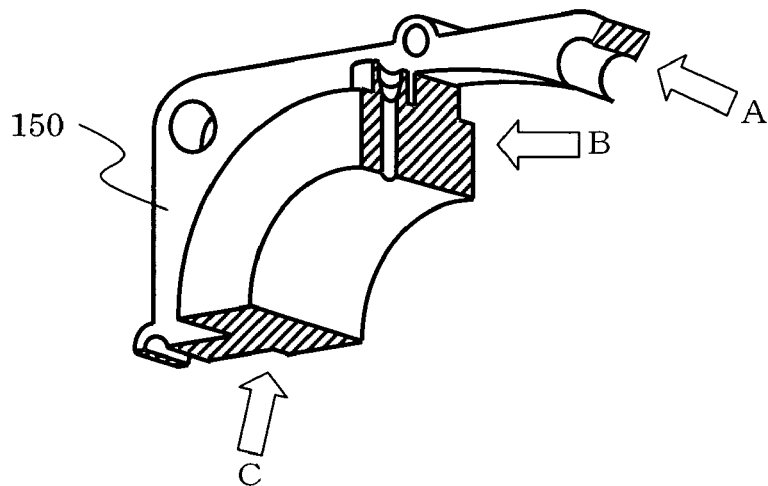
FIGS. 1A to 1E are explanatory views for explaining combination of sectional views according to the present invention with each section plane viewed from the front.
Figure 1B:
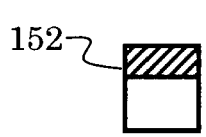
Figure 1C:
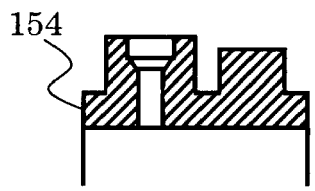
Figure 1D:
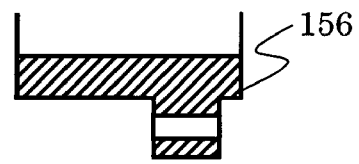
Figure 1E:
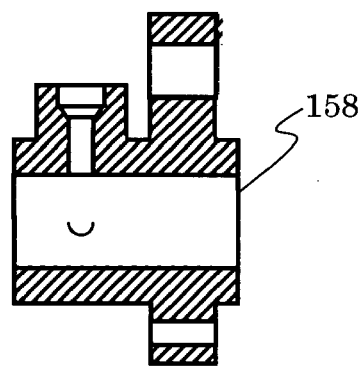

As shown in FIG. 1, a sectional model 150 is viewed from viewing directions A, B, and C and resultant cross sections 152, 154, and 156 shown in each of FIGS. 1B, 1C, and 1D are obtained. And these cross sections are combined into a cross section 158 shown in FIG. 1E. That is, a combined sectional view resulting from cutting an object along a plurality of crossed faces is formed by performing projections plural times (corresponding to the number of section planes) in a direction viewing each section plane from the front, and by combining respective projected views with one another.

Figure 2A:
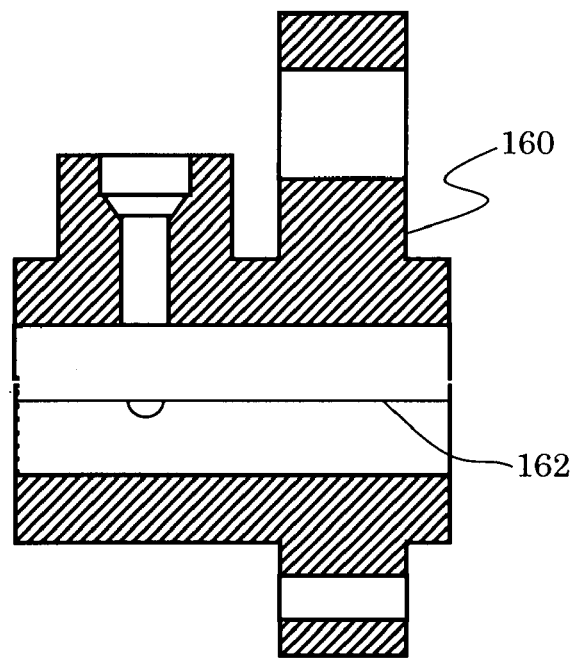
FIGS. 2A and 2B are an explanatory views for explaining removal of an unnecessary portion in combination of sectional views according to present invention.
Figure 2B:
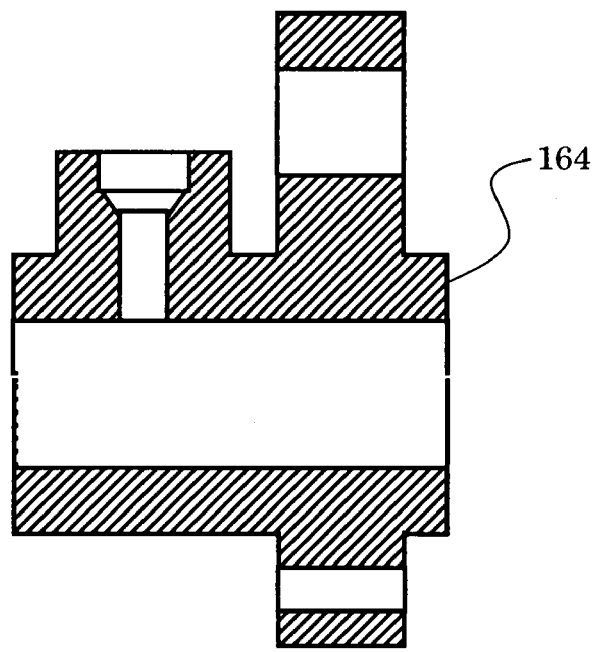

When each sectional view is projected, a portion unnecessary, such as a line 162 in a combined cross section 160 shown in FIG. 2A, in the final combination is removed at the time of projection such as the combined cross section 164 shown in FIG. 2B. This contributes to solving the problem (described with FIG. 25) caused when unnecessary portions are cut away from a three-dimensional model and the remaining model portion is projected in practice.

Figure 20A:
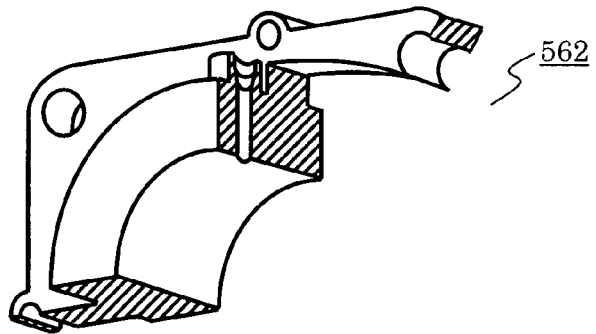
FIGS. 20A to 20C show an example of a sectional view resulting from cutting an object along three planes.
Figure 20B:
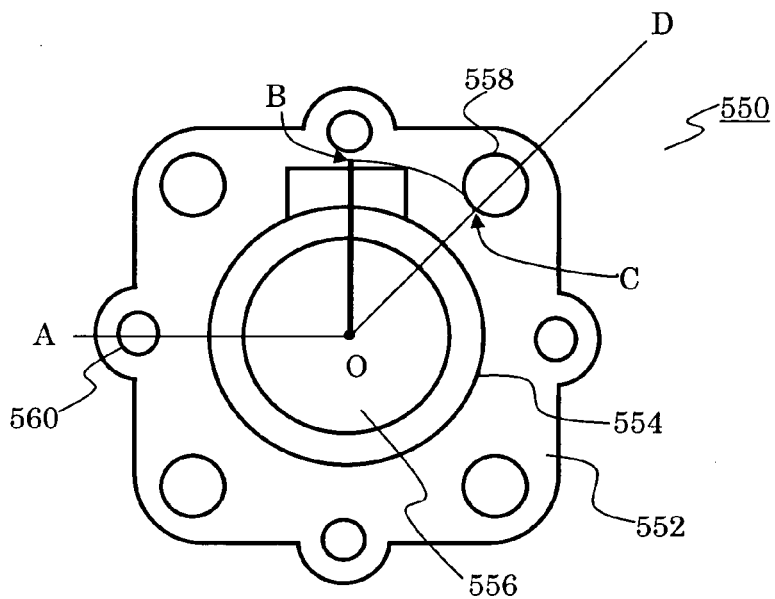
Figure 20C:
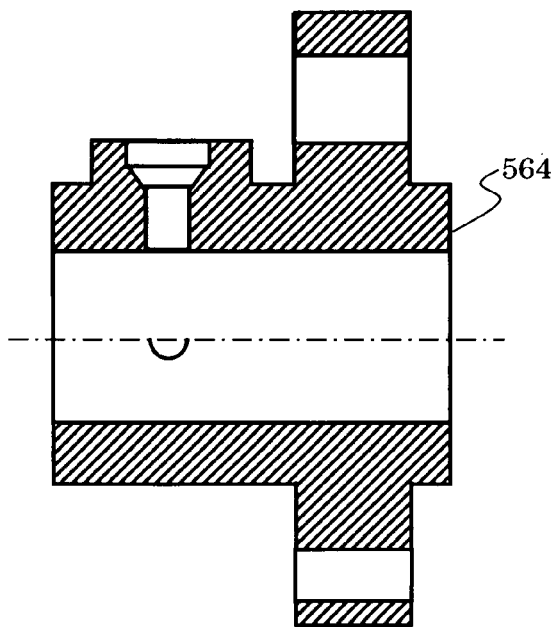
Figure 21B:
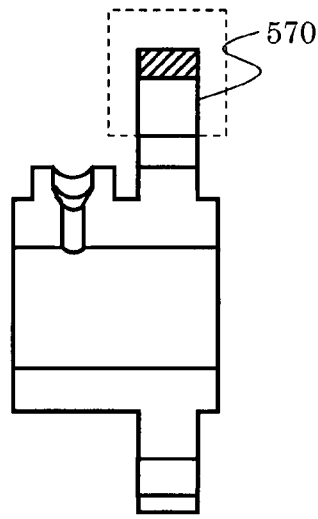
FIGS. 21A to 21E show an example of a sectional view obtained by combining a plurality of detailed views.
Figure 21A:
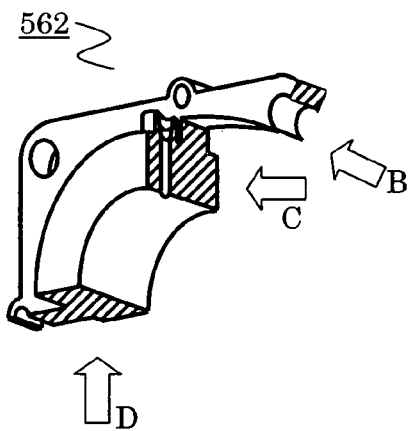
Figure 21C:
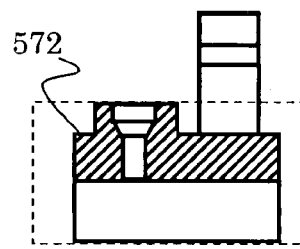
Figure 21E:
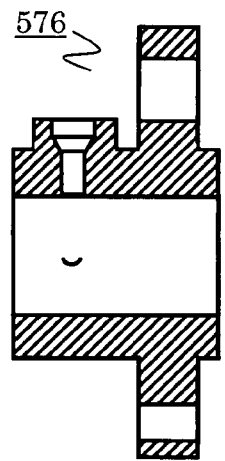
Figure 21D:
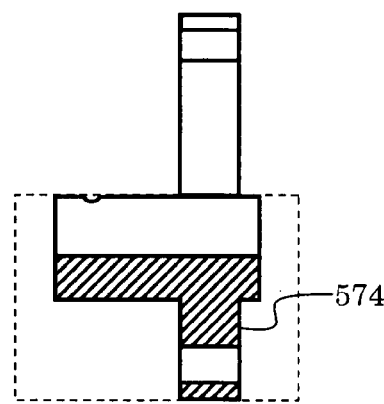
Figure 23A:
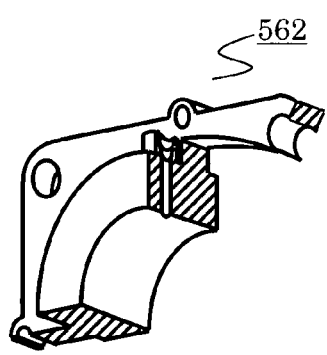
FIG. 23A to 23F are explanatory views for explaining a problem with a view range of a sectional view produced by combining a plurality of detailed views (when a model is magnified)
Figure 23C:
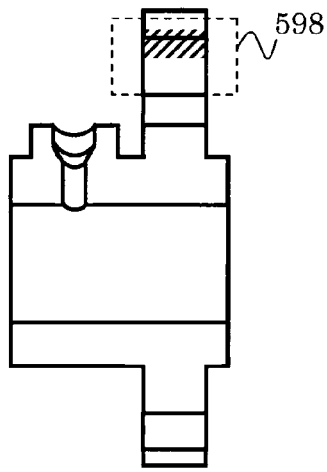
Figure 23F:
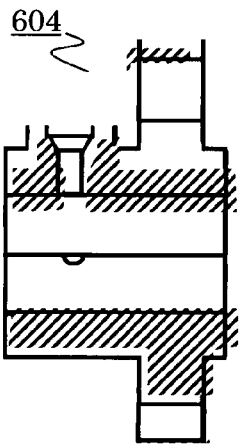
Figure 23B:
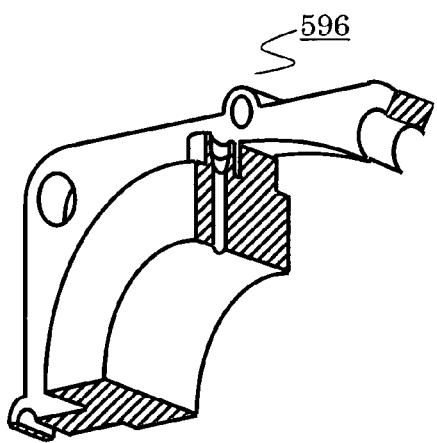
Figure 23D:
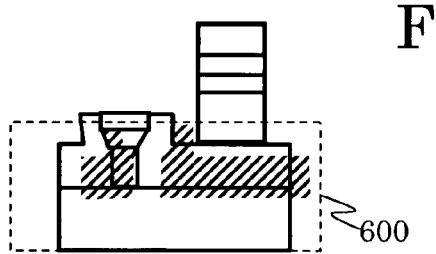
Figure 23E:
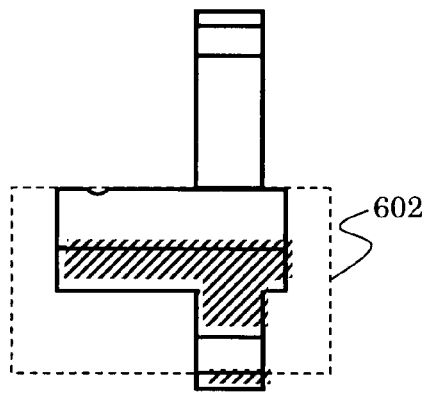
Figure 25B:
FIGS. 25A to 25E show an example of an unnecessary element drawn when a plurality of sectional views are combined.
Figure 25A:
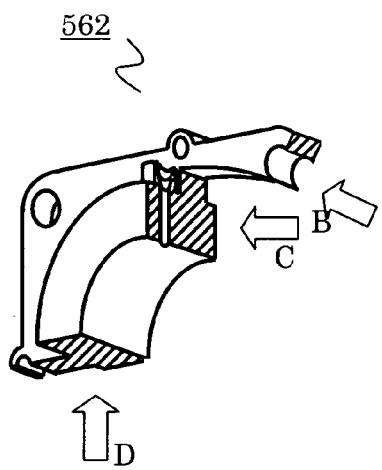
Figure 25C:
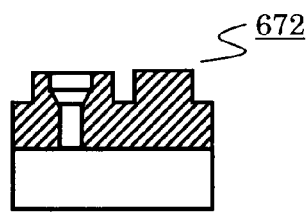
Figure 25E:
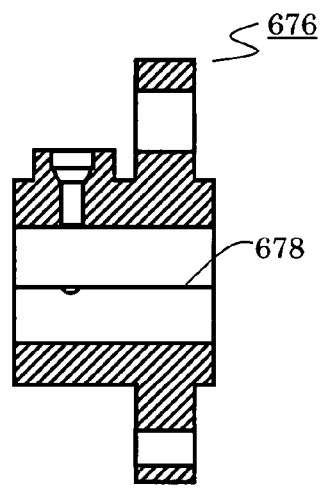
Figure 25D:
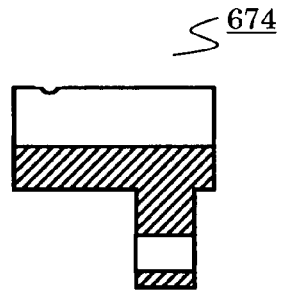

In the case of a complex combined sectional view, there is a special cutting method as shown in FIG. 20. In that case, an objective sectional view can be drawn by omitting a portion cut along the cylindrical shape, in FIG. 20, from the sectional views to be combined.

Since information of the combined sectional views is automatically prepared from information held by the three-dimensional model, a drawing can be automatically re-formed in response to change of the model shape.

The above description will be explained with embodiments below.

Embodiments of the present invention will be described in detail below with reference to the drawings. The present invention can be practiced in many different modes. Accordingly, the scope of the present invention should not be construed from the following description. Note that, throughout the embodiments, the same elements are denoted by the same reference characters.

While the embodiments are described primarily in connection with an apparatus, the present invention can also be practiced, as apparent to those skilled in the art, as a program usable in a computer. Thus, the present invention can be practiced in the form of hardware, in the form of software, and in the combined form of software and hardware. The program can be recorded on an arbitrary computer readable medium, e.g., a hard disk, a CD-ROM, an optical storage device, and a magnetic storage device.

First Embodiment of Present Invention

A combined sectional view producing apparatus according to this embodiment will be described below with reference to the drawings.

[1. Block Diagram of Apparatus]

Figure 3A:
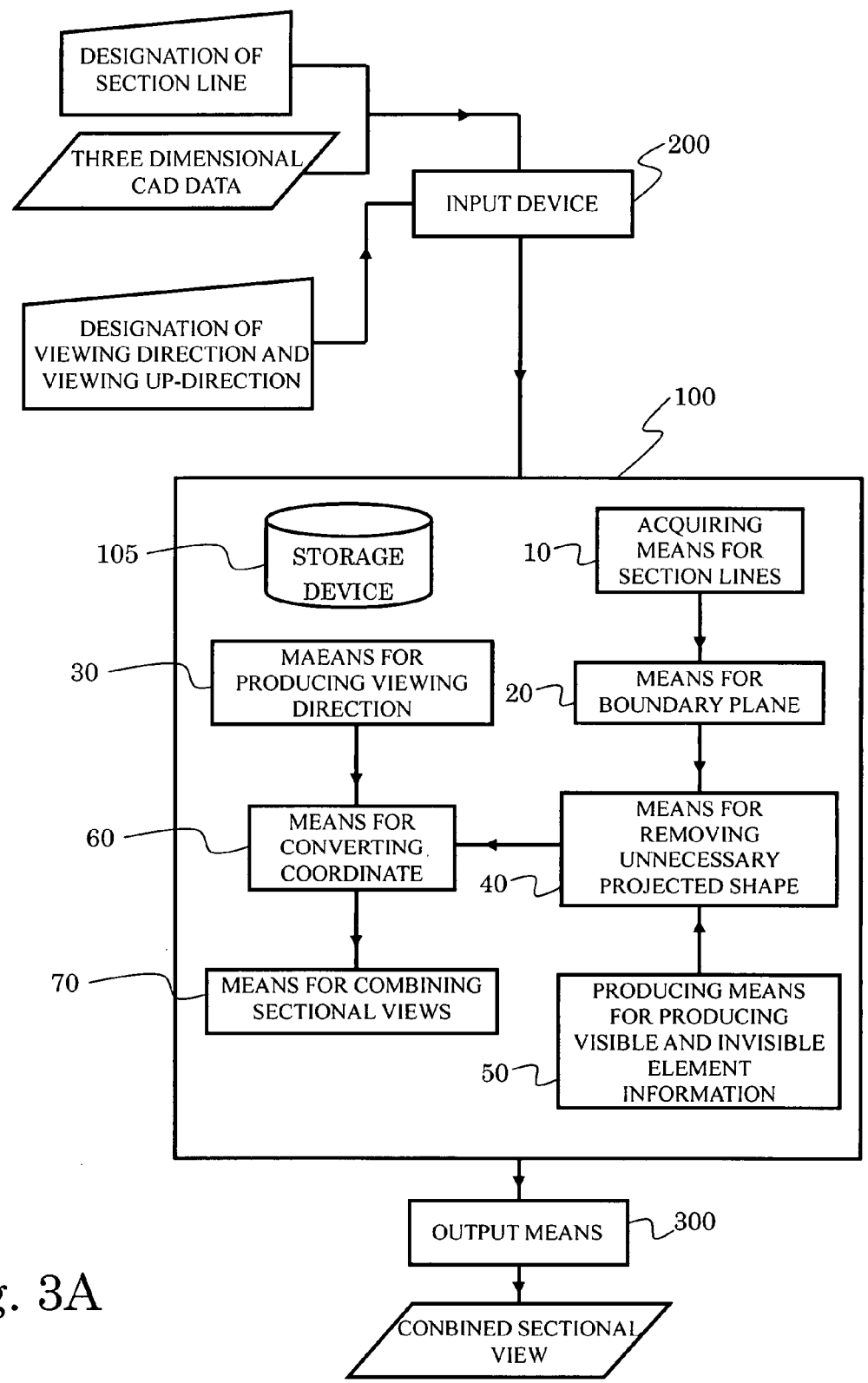
FIGS. 3A and 3B are exemplary block diagrams of a combined sectional view producing apparatus according to a first embodiment of the present invention.

FIG. 3A is a block diagram of the combined sectional view producing apparatus according to this embodiment.

The combined sectional view producing apparatus 100 according to this embodiment can comprise input means 200 for taking in data, output means 300 for sending out data. In FIG. 3A, the combined sectional view producing apparatus 100 section line comprises acquiring means 10, boundary plane producing means 20, viewing direction producing means 30, unnecessary projected shape removing means 40, visible element information producing means 50, coordinate converting means 60, and sectional view combining means 70.

The section line acquiring means 10 has the function of acquiring a section line from a section line list in response to designation by a user.

The boundary plane producing means 20 has the function of obtaining boundary planes based on a section line and a connected section line, i.e., a section line connected to the former section line. Among the boundary planes, one that is obtained without using the connected section line is a section plane. The section plane is specified by the section line and a normal line vector with respect to the section plane. The other boundary planes than the section plane are obtained from a cross point between the section line and an adjacent section line, a plane on which the section line is drawn, and the section plane.

The viewing direction producing means 30 has the function of setting, as a viewing direction, a vector in a direction reversal to the normal line vector of the section plane. A rotation matrix is obtained from a viewing direction designated by the user and a viewing direction to be produced, and a viewing up-direction to be produced is obtained from a viewing up-direction designated by the user and the obtained rotation matrix.

The unnecessary projected shape removing means 40 removes an unnecessary projected shape by cutting at the section plane and the adjacent section plane. For the section plane, a shape thereon is left remained, but for the adjacent section plane, a shape thereon is also removed. With that function, an unnecessary linear line can be prevented from being drawn when a combined sectional view is produced.

The visible element information producing means 50 has the function of producing information regarding an element or a part of an element which can be seen when looking the element in the viewing direction.

The coordinate converting means 60 has the function, i.e., the function of performing coordinate conversion, from three-dimensional information to two-dimensional information, of an element including a part of the element of which shape has been removed with respect to a plane specified from the produced viewing direction and the produced viewing up-direction.

The sectional view combining means 70 has the function of combining sectional views, which are set as targets to be combined, on the basis of a crossed axis between section planes, thereby obtaining a combined sectional view.

The input means 200 has the function of taking in not only three-dimensional CAD data (which may be three-dimensional CAD data of a sectioned model which has been cut along a section plane over a range designated by a section line, or three-dimensional CAD data of a three-dimensional model before it is cut), but also the section line, the viewing direction and the viewing up-direction which are designated by the user. The designation of the section line by the user is made by designating a segment on an orthographic view (such as a front view) of an object. The section plane can also be designated when the object is three-dimensionally represented. Further, since all section planes are each perpendicular to a drawing plane, the user can designate the section plane under such a condition. The designation of the viewing direction and the viewing up-direction can be made by inputting a vector, or by designating a certain section line and further designating to which one of orthographic views (such as a right side view and a bottom view) the sectional view indicated by the certain section line corresponds. Of course, the designation of the viewing direction and the viewing up-direction may also be performed by setting an arrow on a two-dimensional space or a three-dimensional space.

The output means 300 has the function of sending out the combined sectional view obtained by the sectional view combining means 70.

[2. Block Diagram of Hardware]

Figure 3B:
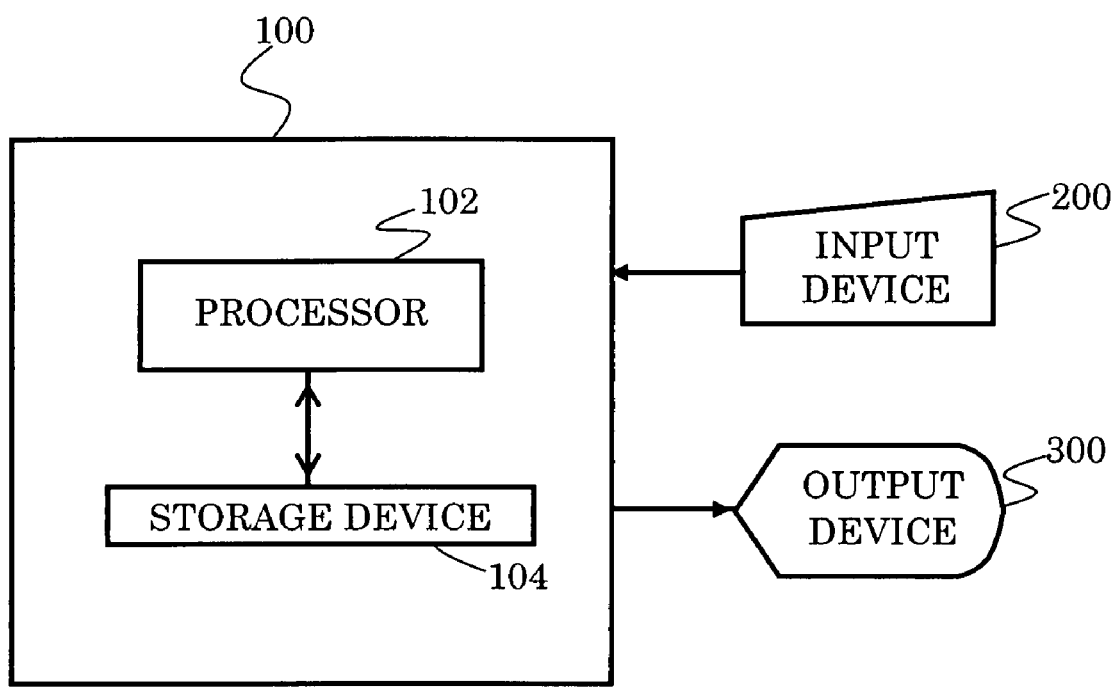

Referring to FIG. 3B, the hardware of the apparatus 100 is explained. A computer or processor 102 on which the combined sectional view producing apparatus is constructed comprises, for example, a Central Processing Unit (CPU), a storage device 104 such as a main memory, e.g., a DRAM (Dynamic Random Access Memory), a HD (hard disk) as an external storage device. The apparatus can be connected to input device 200 such as a keyboard, a mouse, or a touch panel which serve as an input device, and an output device 300 such as a monitor, a plotter, or a LAN card as an expansion card for connection to a network. As the apparatus 100, the input device 200 or the output device 300 can be included.

Stated another way, the sectional view producing apparatus is constructed on the computer through the so-called installation, i.e., through the steps of copying a combined sectional view producing program recorded on an external storage device, such as a CD-ROM, in the HD of the computer and bringing the combined sectional view producing program into a readable and executable state.

[3. Operation]

A unit executing the operation is any of the above-described means or the main, and it is the CPU from the viewpoint of hardware. Also, the functional configuration of each of the above-described means is one example, and each means may have various functional configurations as apparent to those skilled in the art.

Figure 4:
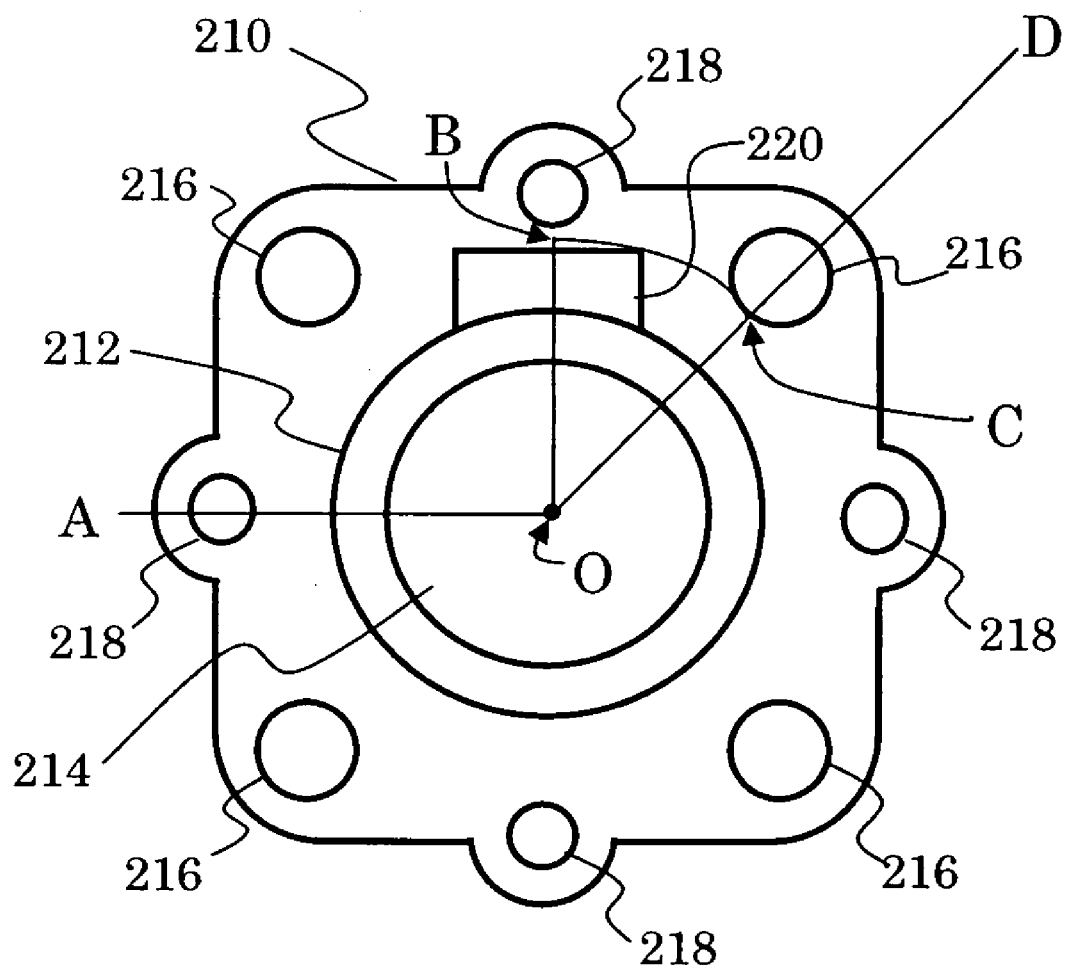
FIG. 4 shows examples of a section line for which a section position is defined according to the first embodiment of the present invention.
Figure 5:
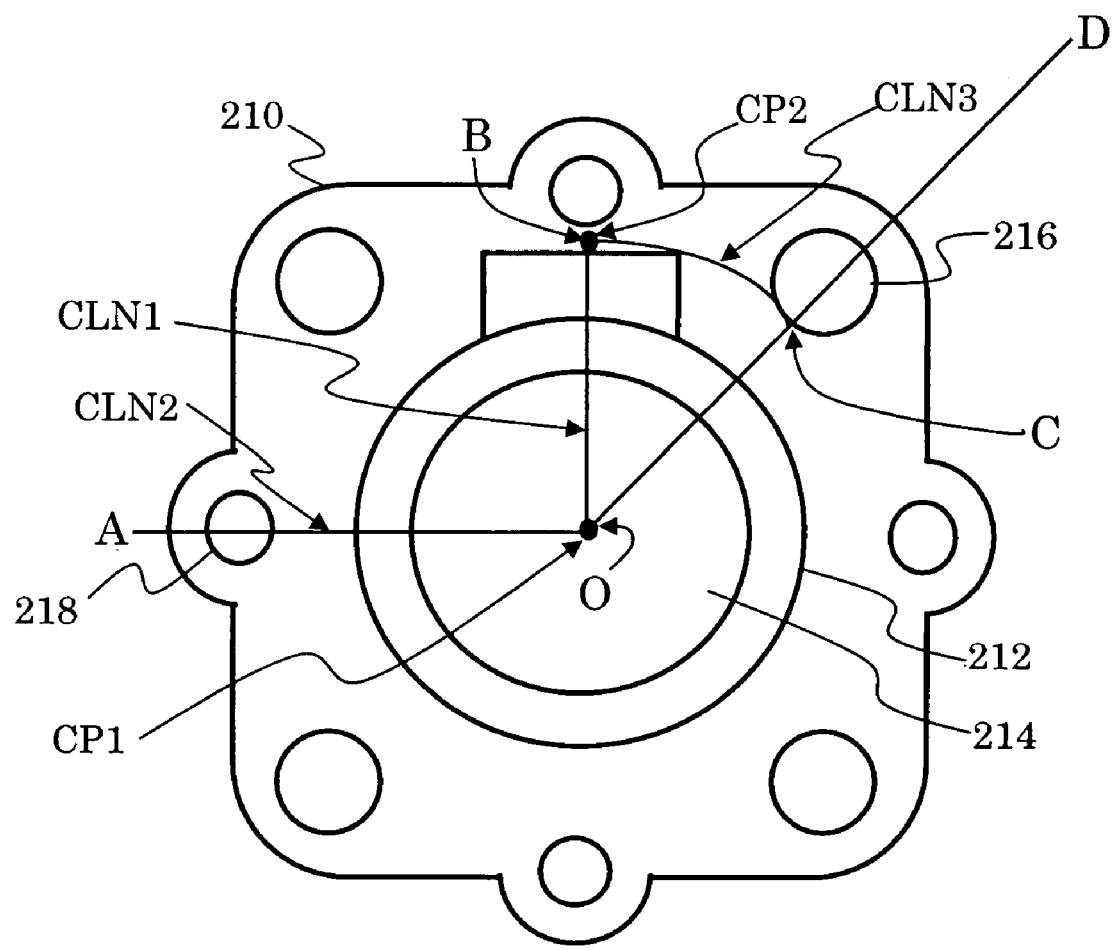
FIG. 5 shows examples of positions of the section line and a cut point according to the first embodiment of the present invention.
Figure 13:
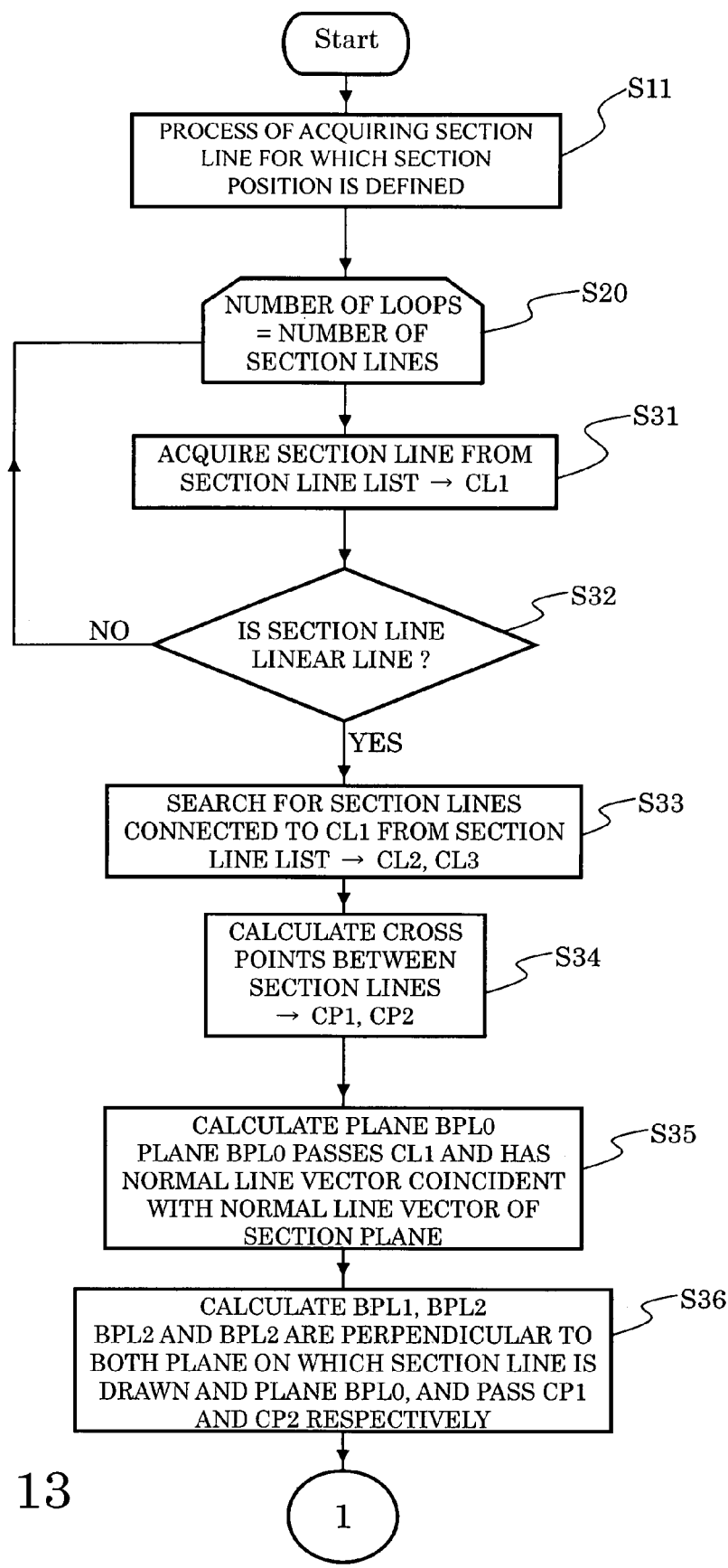
FIG. 13 is a first part of a processing flow according to the first embodiment of the present invention.

A part 210 to be drawn by the apparatus 100 is shown in FIG. 4, where the part has a flange 211, a cylinder 212 including a hollow 214 which are positioned at the center of the flange 211, and holes 216 and 218 are on a circle. The input means 200 acquires, from a three-dimensional model of which sectional view is to be formed, information of a section line for which a section position is defined (S11, hereinafter the step is referred to FIG. 13). For example, as shown in FIG. 4, the input means 200 acquires information of a section line 1 (a segment AO), a section line 2 (a segment OB), a section line 3 (an arc BC), a section line 4 (a segment CD), and a plane on which each of those section lines is drawn. FIG. 5 shows the section lines, CLN1, CLN2, and CLN3 corresponding the section line 2, the section line 1, the section line 3 respectively. The input means 200 takes in the three-dimensional CAD data itself. A drawing target, i.e., the part 210 shown in FIG. 4, has a substantially rectangular shape with a predetermined thickness in which circular holes 216 and 218 are formed at a plurality of coaxial positions rotationally spaced from one another.

First, information for projecting each sectional view (i.e., the projecting direction and the plane for which the unnecessary portion is to be deleted) is obtained. More specifically, that information is obtained as follows.

Steps S31 through S43, described later, are looped in the same number as that of section lines, where the loop is shown by symbols S20 and S21. By repeating those steps in the same number as that of section lines, sectional view information corresponding to the number of linear section lines can be acquired.

The section line acquiring means 10 acquires a section line from a section line list (S31), which is stored in the storage device 105 of FIG. 3A. For example, a section line CLN1 is acquired.

The boundary plane producing means 20 determines whether the acquired section line is a linear line (S32). If the acquired section line is other than a linear line, the processing returns to S20.

If the acquired section line is a linear line, the boundary plane producing means 20 searches for a section line connected to a target section line (S33, FIG. 5). For example, if a section line CLN1 is the target section line, section lines CLN2 and CLN3 are searched for. In practice, it is determined whether the target section line and any other section line in the section line list are connected to each other.

The boundary plane producing means 20 finds a crossed point between the target section line and the connected section line (S34). For example, a crossed point CP1 (see FIG. 5) between the target section line CLN1 and the connected section line CLN2 and a crossed point CP2 (see FIG. 5) between the target section line CLN1 and the connected section line CLN3 are obtained as CP1 and CP2, respectively (FIG. 5).

The boundary plane producing means 20 finds a plane which passes the target section line and has a normal line vector coincident with a normal line vector of a section plane corresponding to the target section line of the three-dimensional model (S35). For example, referring to FIG. 6, a plane BPL0 passing the target section line CLN1 (see FIG. 5) and having a normal line vector NV0 coincident with a normal line vector of the section plane of the three-dimensional model is calculated, where the direction of the normal line vector is defined as positive when the vector direction is from the sectioned model to out of the model.

Figure 6:
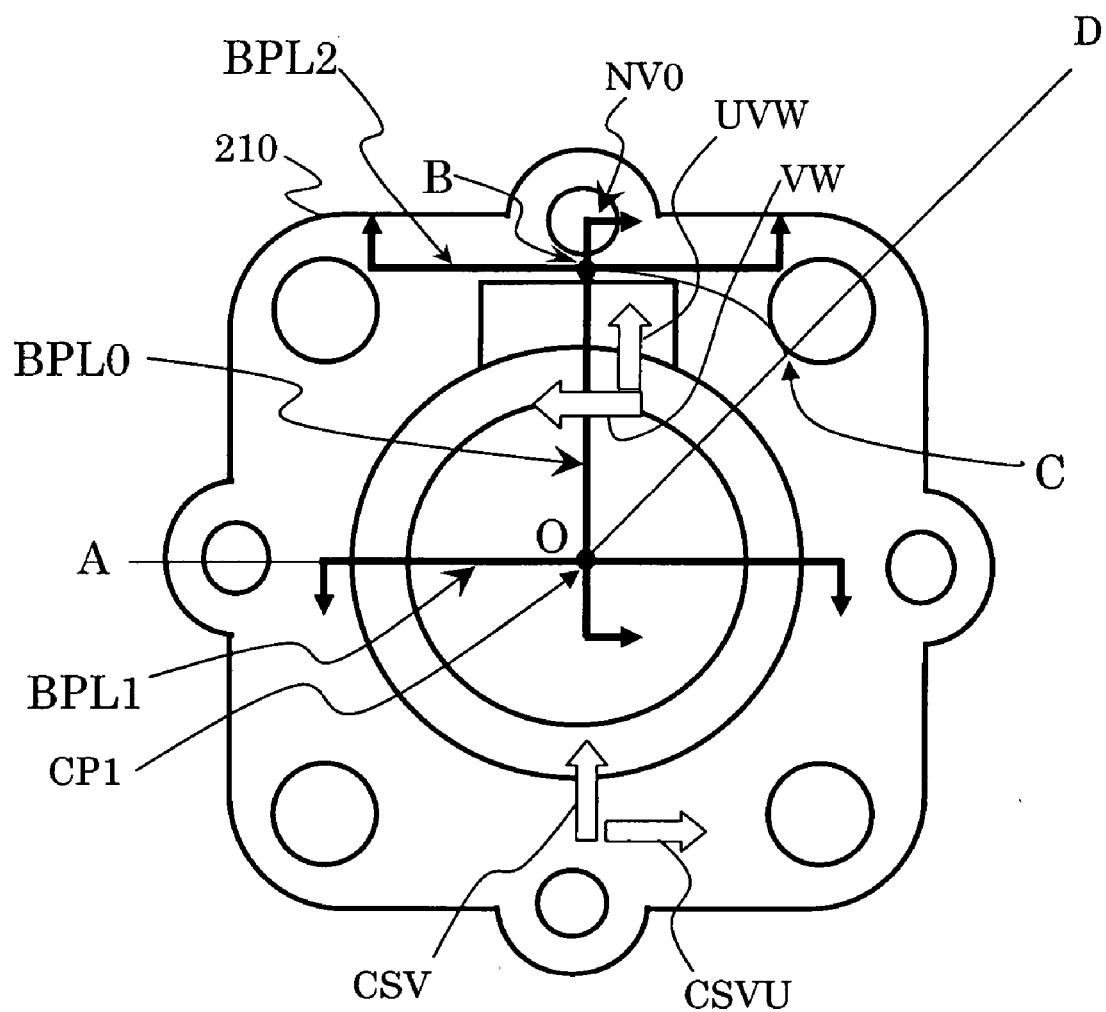
FIG. 6 shows examples of a boundary plane according to first embodiment of the present invention.

The boundary plane producing means 20 finds planes which are each perpendicular to both the plane including the target section line drawn thereon and the section plane corresponding to the target section line and which pass the crossed point between the section lines (S36). For example, planes being perpendicular to both the plane on which the section line is drawn and BPL0 and passing CP1/CP2 are calculated (BPL1/BPL2) (FIG. 6). Additionally, a normal line vector of BPL1 is directed from CP2 to CP1, and a normal line vector of BPL2 is directed from CP1 to CP2.

Figure 14:
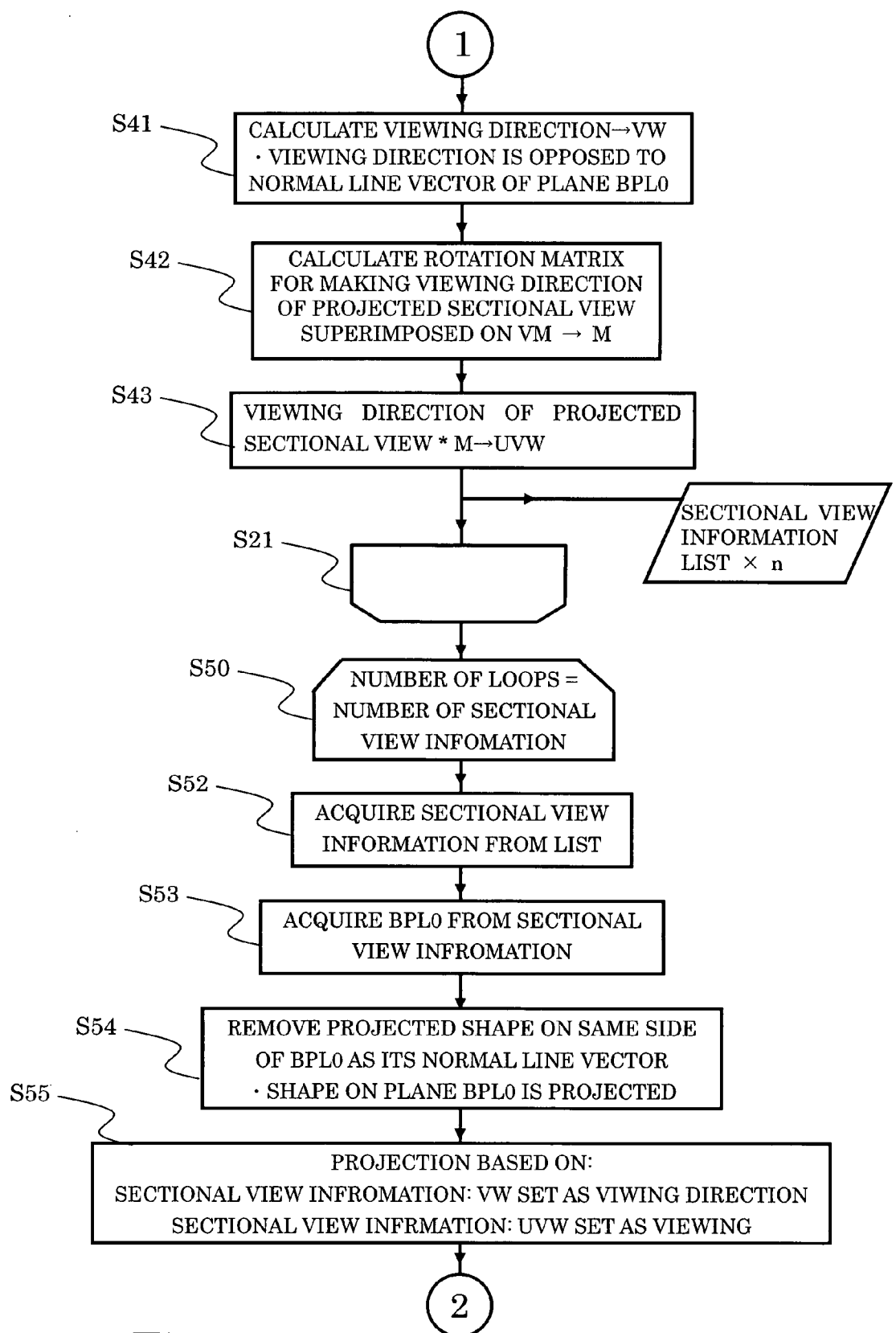
FIG. 14 is a second part of a processing flow according to the first embodiment of the present invention.

The viewing direction producing means 30 obtains the viewing direction for the section plane corresponding to the target section line as a direction reversal to the normal line vector of the relevant section plane (S41 in FIG. 14). For example, from a normal line vector NV0 of the section plane BPL0, the viewing direction of the section plane BPL0 is obtained as the direction reversal to NV0 (shown in FIG. 6). The viewing direction is denoted by VW in FIG. 6.

A rotation matrix is obtained (S42) to superimpose a viewing direction vector CSV in FIG. 6 of the sectional view on the viewing direction vector VW of the section plane corresponding to the target section line, which is obtained by the viewing direction producing means 30. For example, a rotation matrix M for making the viewing direction vector CSV of the sectional view superimposed on the viewing direction vector VW of the section plane is calculated (shown in FIG. 7).

Figure 7A:
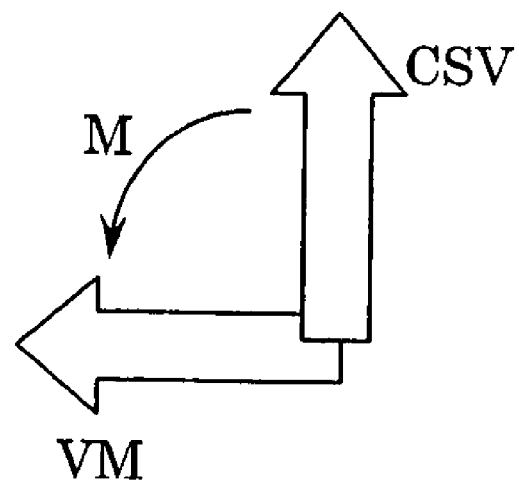
FIGS. 7A and 7B are explanatory views for explaining how to obtain a viewing up-direction vector of a combined sectional view according to the first embodiment of the present invention.
Figure 7B:
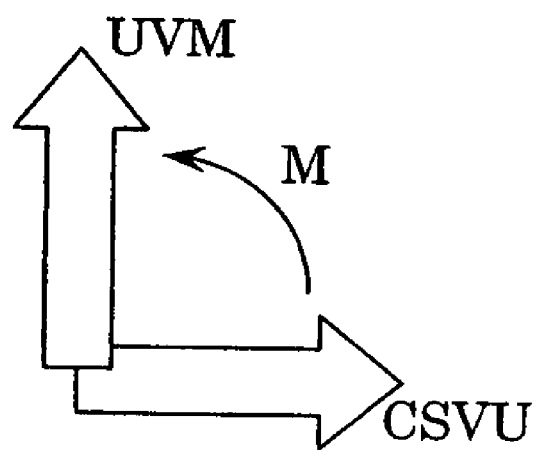

The viewing direction producing means 30 multiplies a viewing up-direction vector CSUV (shown in FIGS. 6 and 7) of the sectional view by the obtained rotation matrix, thus obtaining a viewing up-direction vector CSUV of the section plane corresponding to the target section line (S43). For example, the viewing up-direction vector CSUV of the sectional view is multiplied by the obtained rotation matrix M to obtaining a rotated vector UVW (FIG. 7).

The viewing direction vector of the section plane, the viewing up-direction vector of the section plane, the section plane, and the adjacent section planes are held as the sectional view information. For example, the viewing direction vector VW of the section plane, the viewing up-direction vector UVW of the section plane, the section plane BPL0, the adjacent section plane BPL1, and the adjacent section plane BPL2 are held as one group of the sectional view information in the storage device 105 in FIG. 3A.

By executing the loop between S20 to S21, the sectional view information is obtained for, e.g., the section lines 1-4. Note that the sectional view information is not present for the section line 3 because it is not a linear line. Then, with loops of S50 and S51, processing of S52 through S74 is repeated in the same number as that of the obtained sectional view information (shown FIGS. 14 and 15). Respective sectional views can be each obtained with that processing.

The unnecessary projected shape removing means 40 acquires the sectional view information from the storage device 105 shown in FIG. 3A (S52).

The unnecessary projected shape removing means 40 acquires a section plane (S53). For example, BPL0 is acquired for the section line OB.

Figure 8:
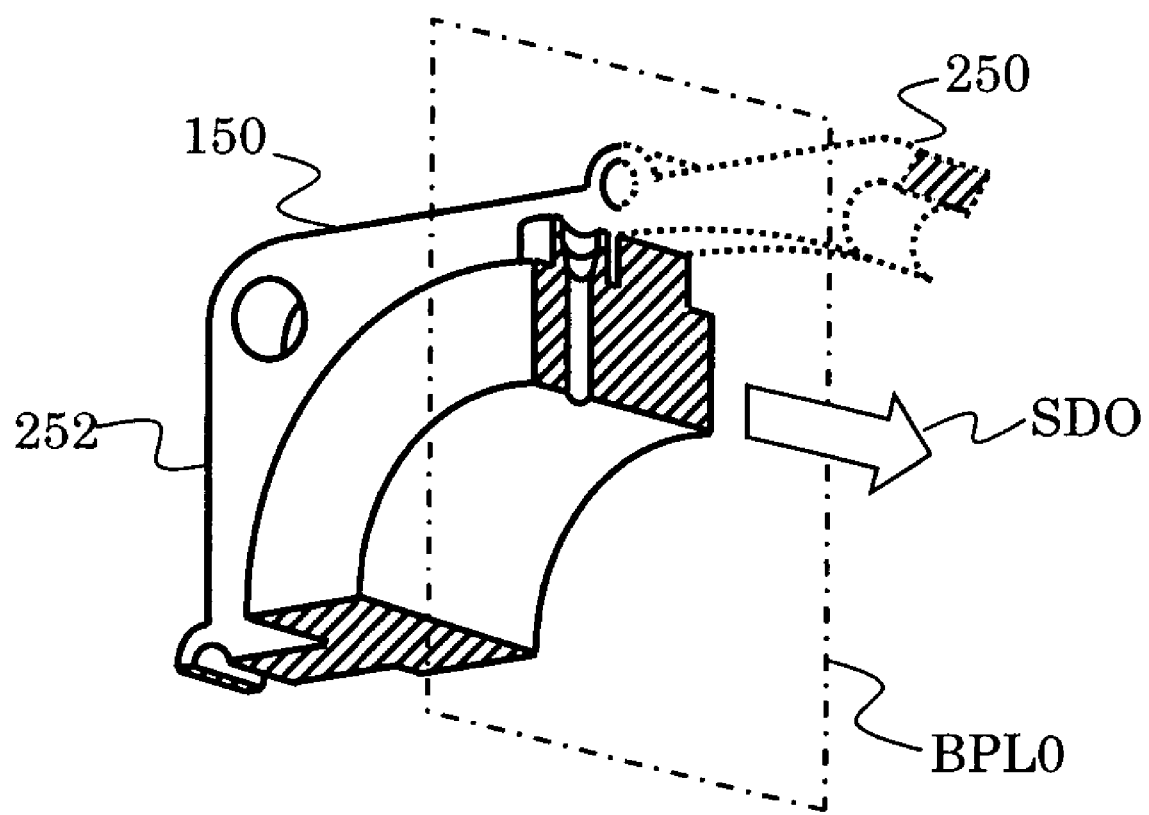
FIG. 8 shows an example of removal of an unnecessary portion by cutting at the section plane and the shape on the plane being not removed according to the first embodiment of the present invention+

The unnecessary projected shape removing means 40 removes a projected shape positioned on the same side of the section plane as its normal line vector (S54). That is, referring to FIG. 8, the shape 250 depicted with dotted line in the side, which shown the arrow SDO, sectioned by the section plane BPL0 drawn with dashed dotted line is removed. A shape on the section plane is not removed. For example, a projected shape on the same side of BPL0 as its normal line vector is removed, and a shape on BPL0 is not removed.

The visible element information producing means 50 performs projection with respect to the viewing direction vector of the section plane and the viewing up-direction vector of the section plane based on the acquired sectional view information (S55). For example, the projection is made using the viewing direction vector VW of the section plane and the viewing up-direction vector UVW of the section plane. More specifically, the visible element information producing means 50 acquires visible element information of elements (faces, lines and points) of the three-dimensional model when looking it in the viewing direction and the viewing up-direction (the visible element information may also be acquired with respect to only the viewing direction). Thus, the means 50 acquires the visible element information as information for the projection. In other words, the visible element information is specified as information for the projection. Invisible element information can also be acquired to draw hidden lines. A certain element becomes invisible when it is concealed by one or more other elements. In some cases, the entirety of the element becomes invisible, and in other cases, a part of the element becomes invisible. The reason why the visible element information is acquired after removing a part of the three-dimensional model in the above-described S53 and S54 is to avoid a cut face from being concealed by the part of the three-dimensional model when looking it in the viewing direction and the viewing up-direction. If such a consideration is not required, the processing of S53 and S54 can be executed in processing of S71 through S74 described below.

Figure 15:
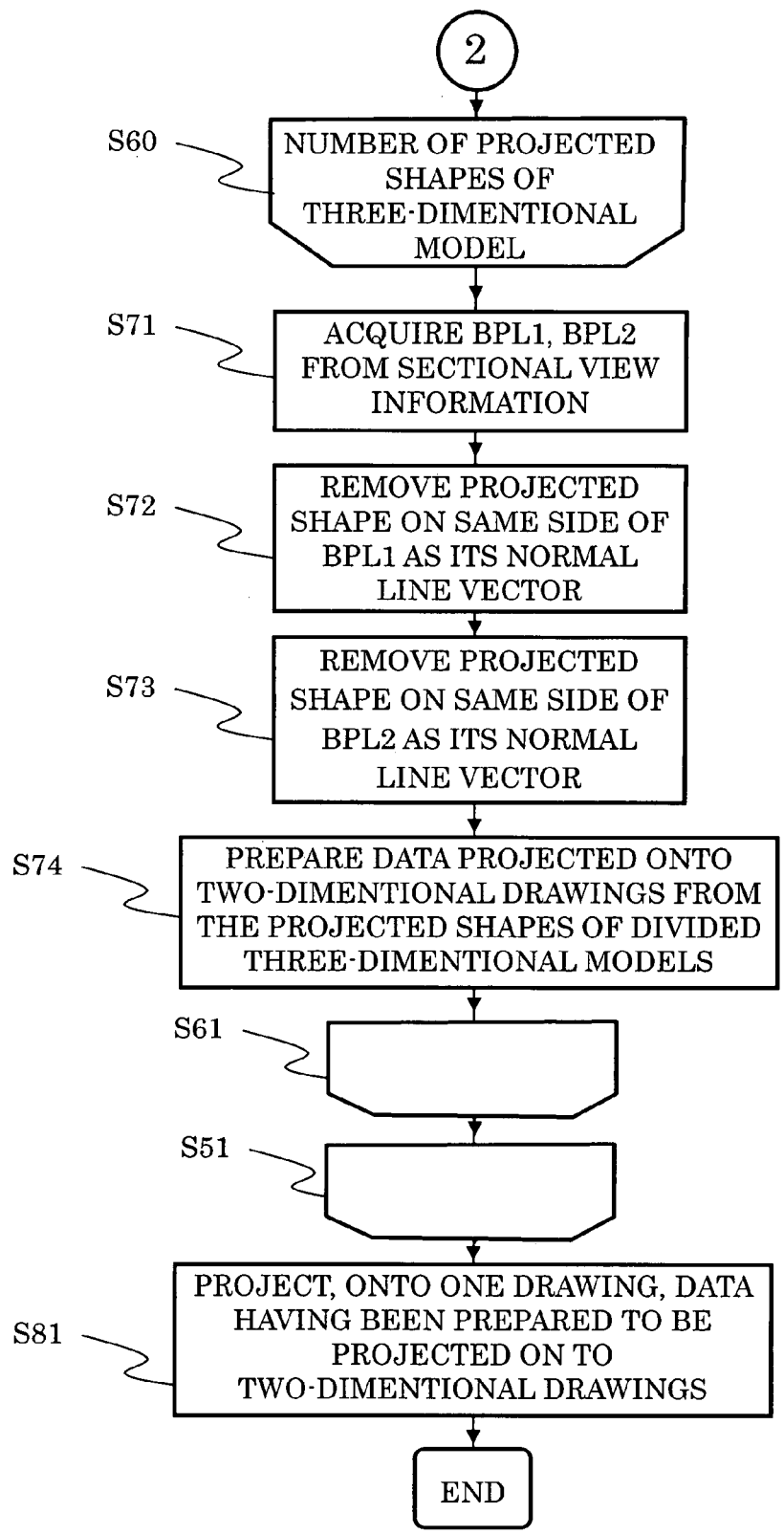
FIG. 15 is a third part of a processing flow according to the first embodiment of the present invention.

The processing of S71 through S74 is repeated in the same number as that of the projected shapes of the three-dimensional model via S60 and S61 (FIG. 15). In other words, that processing is repeated in the same number as that of the elements constituting the visible element information obtained in S53. When the invisible element information is also included, the number of the elements is increased correspondingly.

The unnecessary projected shape removing means 40 acquires the section plane and the adjacent section plane from the sectional view information (S71). Note that the acquisition of the section plane and the adjacent section plane in S71 may be executed only once prior to S60 outside the loop.

Figure 9:
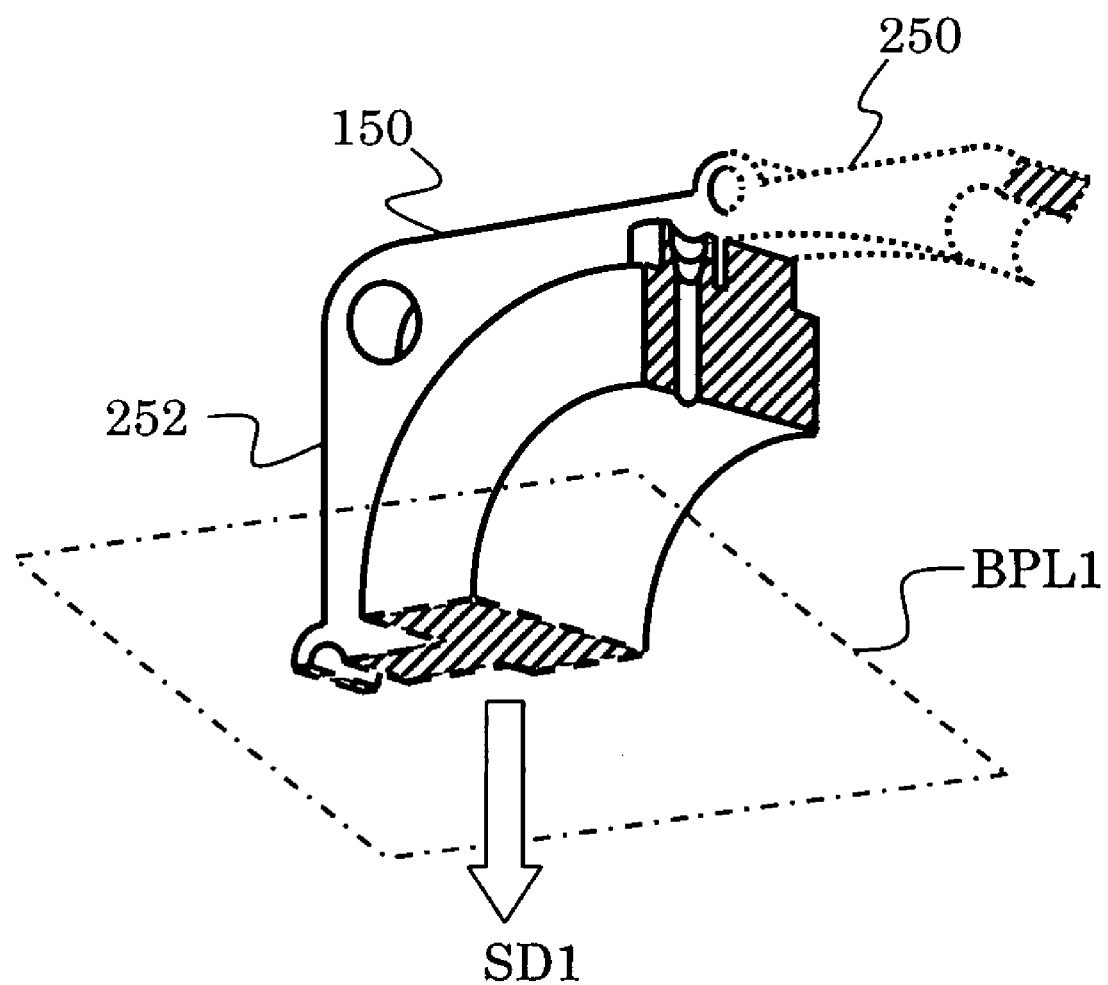
FIG. 9 shows an example of removal of an unnecessary portion by cutting at an adjacent section plane according to the first embodiment of the present invention.
Figure 10:
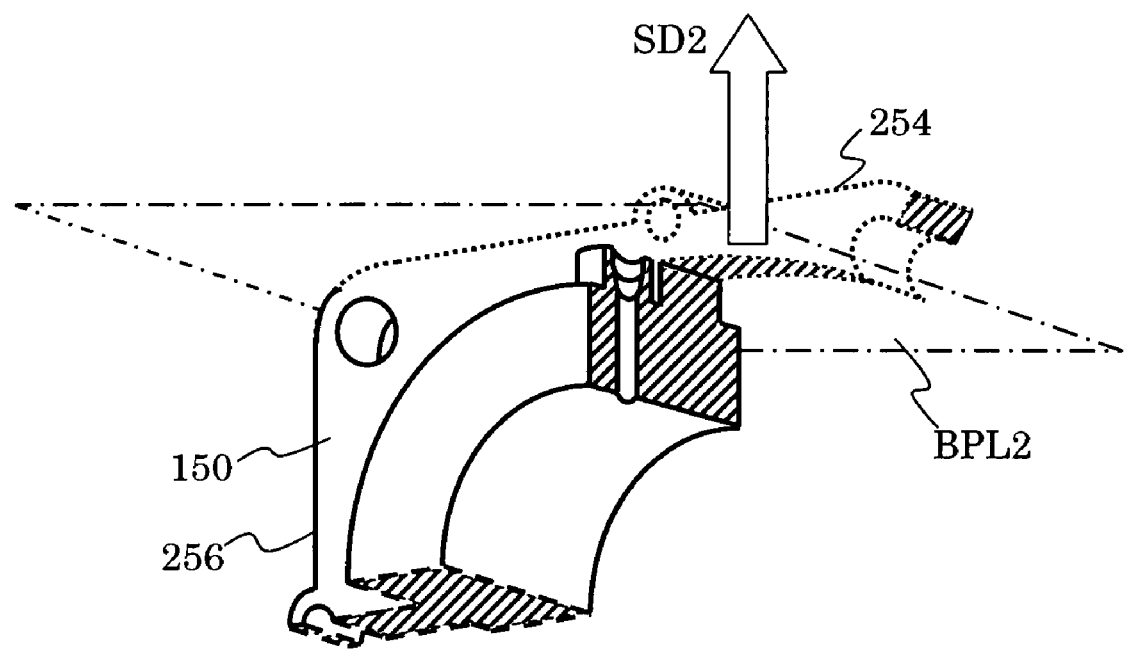
FIG. 10 shows an example of removal of an unnecessary portion by cutting at an adjacent section plane according to the first embodiment of the present invention.

The unnecessary projected shape removing means 40 removes, from the three-dimensional projected shape, the projected shape positioned on the same side of the adjacent section plane as its normal line vector (S72, S73). More specifically, the projected shape is compared with the adjacent section planes BPL1 and BPL2, and other shapes than those positioned on the same sides of the adjacent section planes BPL1 and BPL2 as their normal line vectors and those planes themselves are projected. FIGS. 9 and 10 show the adjacent section planes BPL1 and BPL2 respectively and removed portions are depicted with dotted lines. And the arrows SD1 and SD2 show the side of removed portions in respect of the section planes BPL1 and BPL2. In other words, the shapes positioned on the same sides of the adjacent section planes as their normal line vectors and those planes themselves are removed. Instead of removing the relevant portions, they may be processed as elements not subjected to the drawing target or parts of those elements. An element crossing the section plane is divided at the section plane. The processing of S71 through S73 can be also executed in the processing of S50 through S55. In some installed environments, however, the process of removing the shapes positioned on the adjacent section planes cannot executed in S50 through S55, and it has to be executed in S72 and S73.

Figure 11:
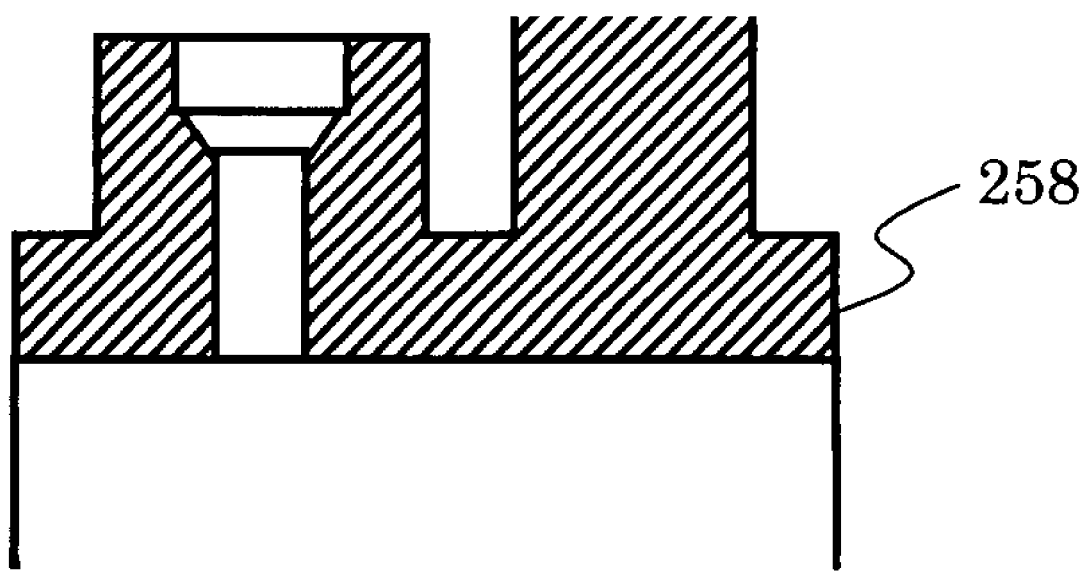
FIG. 11 shows an example of projection after removing an unnecessary portion by cutting at the section plane and the adjacent section planes according to the first embodiment of the present invention.
Figure 12A:
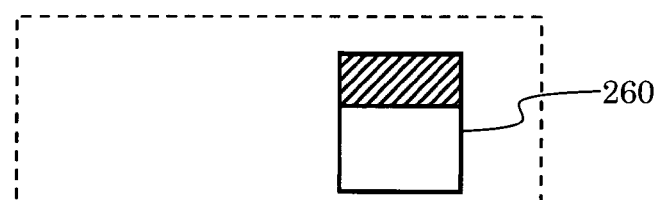
FIGS. 12A to 12D show an example of combination of the sectional views according to the first embodiment of the present invention.
Figure 12B:
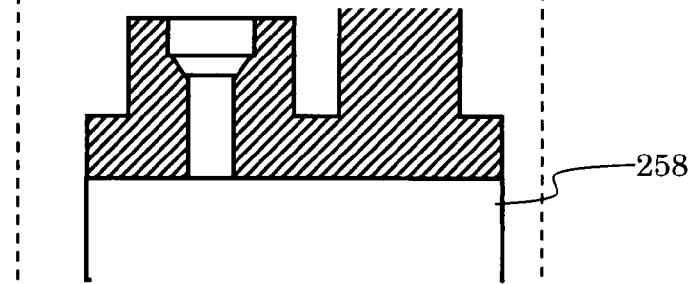
Figure 12C:
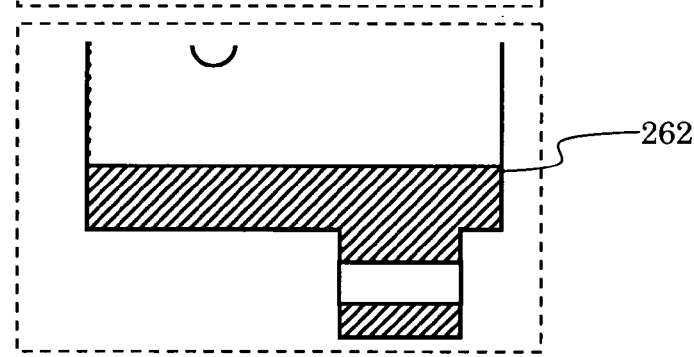
Figure 12D:
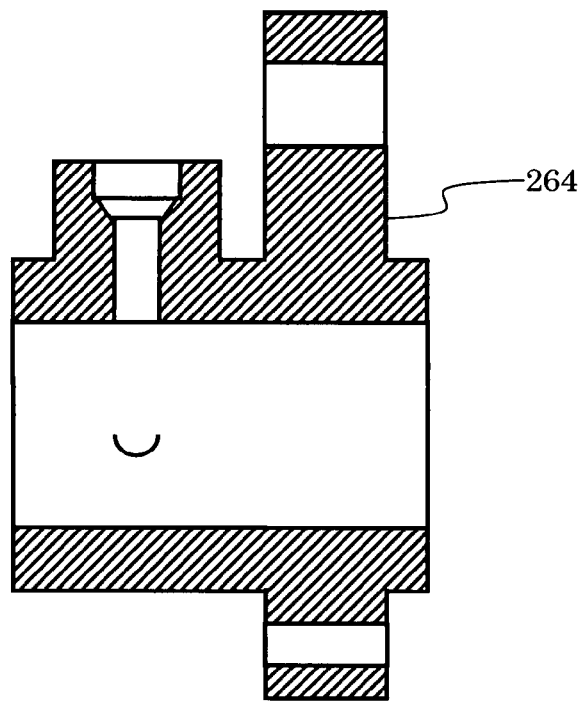

The coordinate converting means 60 prepares, from the projected shapes of the divided three-dimensional model, data to be projected onto a two-dimensional drawing (S74, FIG. 11). In other words, the three-dimensional data is converted to two-dimensional data on the basis of the viewing direction and the viewing up-direction.

The sectional view combining means 70 projects, onto one orthographic view, the data having been thus prepared to be projected onto a two-dimensional drawing (S81). In other words, a combined sectional view sectioned along a plurality of planes crossing each other is formed by combining the sectional views 1,2, and 4 (except for the sectional view 3) obtained by the projections using the sectional view information list based on the two-dimensional data after the coordinate conversion. As shown in FIGS. 12A to 12D, partial sectional views 260, 258, and 262 are combined and the combined sectional view 264 is obtained. In practice, the combined sectional view is formed by, when a crossed axis between the sectional views to be obtained passes the origin of the model, rotating the sectional view with the crossed axis being a center axis.

The output means 300 sends out the combined sectional view thus formed. The output destination is, e.g., a CAD apparatus, each of various means serving as functional components of the CAD apparatus, a display, and a printer. The functions of the input means 200 and the output means 300 are variable depending on the construction of the combined sectional view producing apparatus itself. The combined sectional view producing apparatus can be constructed, for example, as an independent single unit or as one component incorporated in a CAD system.

Other Embodiments

[Case of Cutting along Center Plane Extended Following Curve]

The concrete example of the sectional view described above in connection with the first embodiment is concerned with the case of the combined sectional view having the complex section planes. However, the first embodiment can also be applied even when a model is cut along a center plane extended following a curve.

Figure 16A:
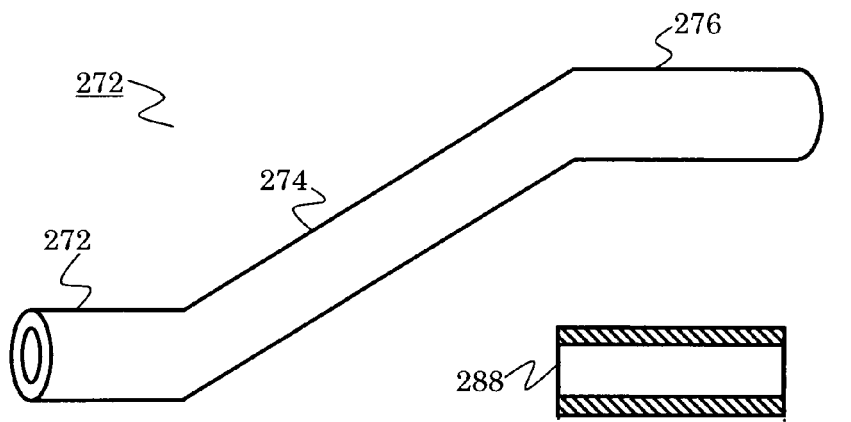
FIGS. 16A to 16D are explanatory views for explaining how to produce the combined sectional view according to another embodiment of the present invention in the case of cutting along a center plane extended following a curve.
Figure 16B:
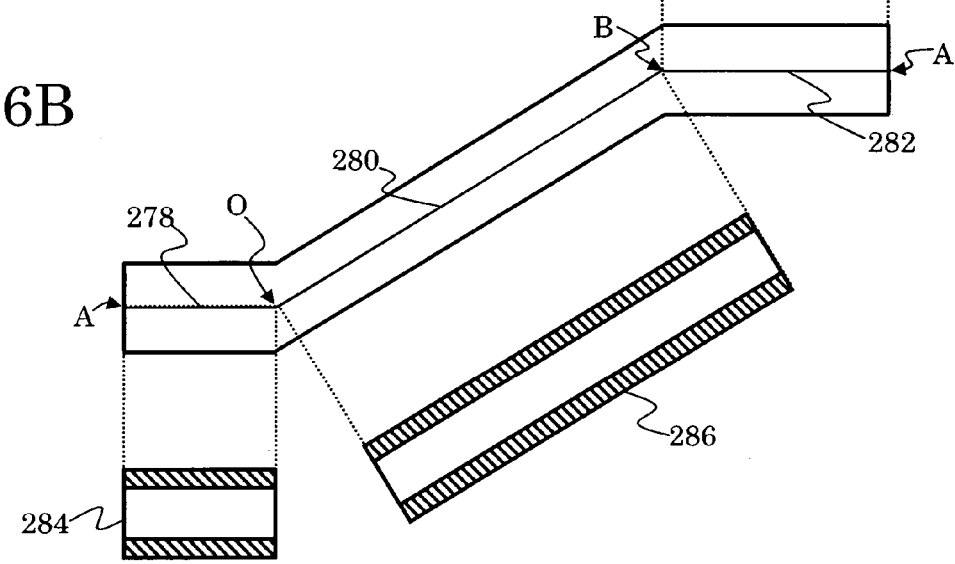
Figure 16C:
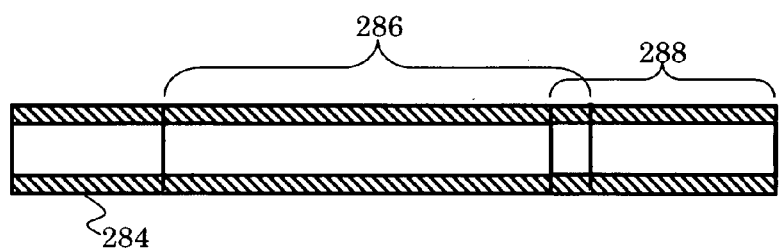
Figure 16D:
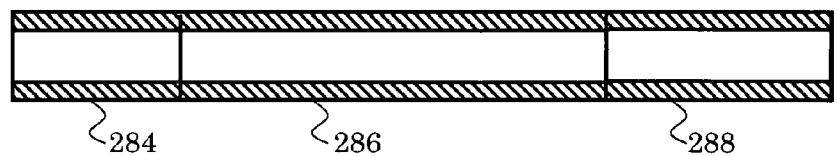

When the user cuts a tube 272 comprising parts 272, 274, and 276, curved as shown in FIG. 16A, along its center plane, designates the viewing direction and the viewing up-direction, and executes the above-described operation of the first embodiment, sectional views 284, 286, and 288 shown in FIG. 16B, in which sectional lines 278, 280, and 282, are first obtained. Further, by combining those sectional views with each other, a combined sectional view shown in FIG. 16C is obtained. Because of the relative relationship of the crossed axes between the sectional views, an overlapped portion may often occur between the sectional views in FIG. 16C when the sectional views are combined with each other. In such a case, the overlapped portion can be eliminated by translating one of the overlapping sectional views through a distance corresponding to the overlapped portion, and the sectional view without a portion overlapped is obtained as shown in FIG. 16D. If a new overlapped portion is generated after the translation, a combined sectional view can be finally obtained by translating one of the overlapping sectional views in a successive way. While the operation of translating one of the overlapping sectional views can be performed by the user, it may be automatically executed by the apparatus with the function of recognizing the ends of the sectional views.

[Color Allocation to Sectional Views]

Figure 17A:
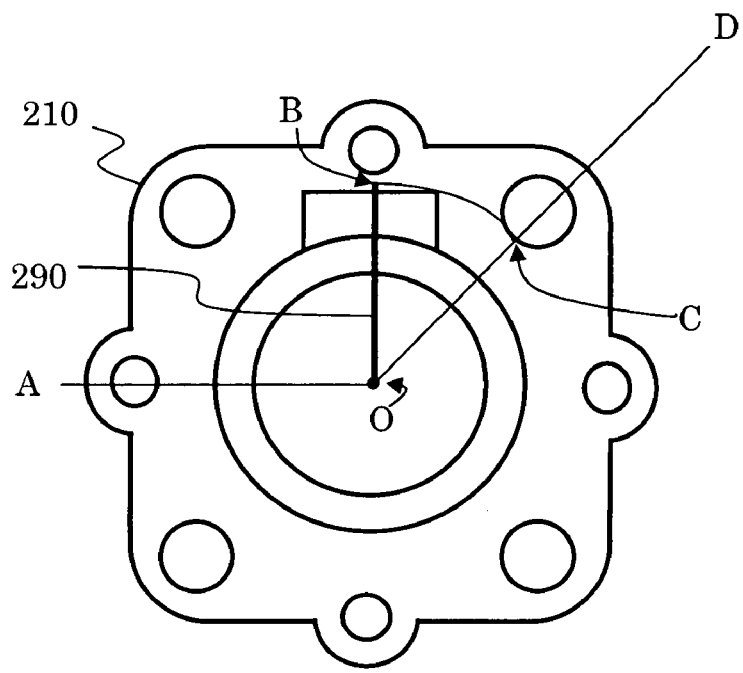
FIGS. 17A and 17D are explanatory views for explaining color allocation to the sectional views according to still another embodiment of the present invention.

In the first embodiment described above, the combined sectional view can be displayed by allocating a different color to each of the sectional views thereof so that the user can easily understand the arrangement of the sectional views constituting the combined sectional view. In FIG. 17A, only portions regarding to the section line OB are colored for convenience of explanation and convenience of drawing. Note that, although those portions are colored in red, the figures themselves are not colored because of restrictions on the drawing from the viewpoint of application formality, and the coloring is indicated by adding lead lines and remarks. More specifically, the user first displays a front view on which the user sets the section line to be colored and then displays the set section line in color (FIG. 17A). Based on the colored section line, the apparatus executes processing so as to present FIG. 17D via FIGS. 17B and 17C, in which the sectional plane and the sectional view 296 are colored with red for example. Usually, the user can see FIGS. 17A and 17D on the display. While the coloring process is described here in connection with the segment OB, it can also be similarly executed for each of the other segments OA, BC and CD and the sectional view corresponding to each section line is colored in the same color as the section line.

Figure 17B:
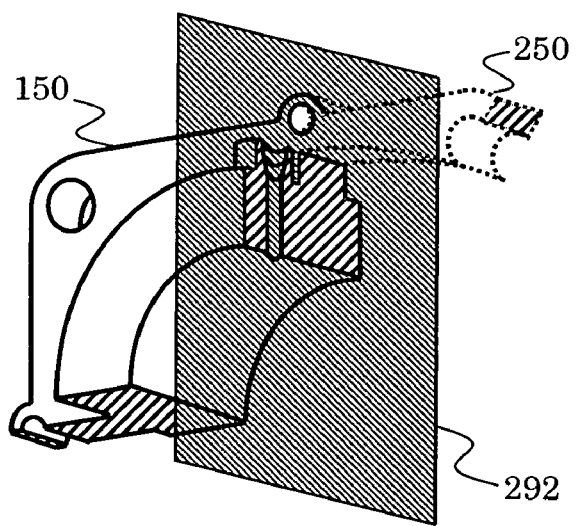
Figure 17C:
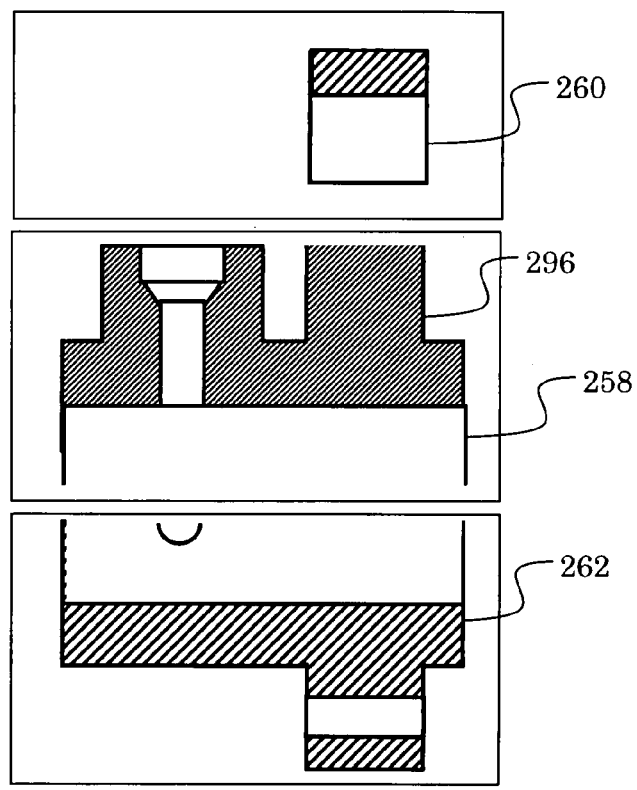
Figure 17D:
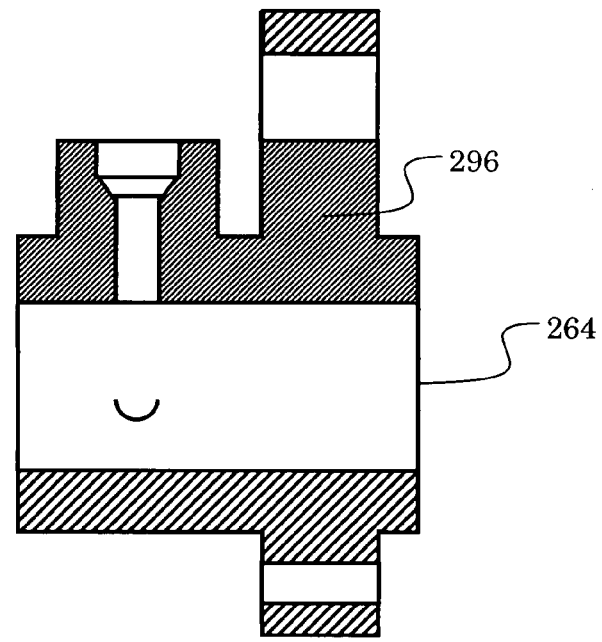
Figure 18A:
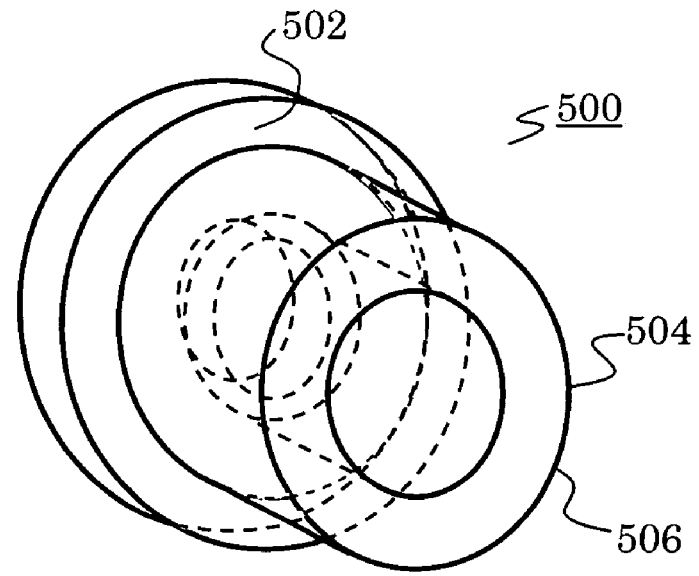
FIGS. 18A and 18B are explanatory views for explaining a method of drawing an object by hidden lines and a method of drawing the object by depicting a section (cut face)
Figure 18B:
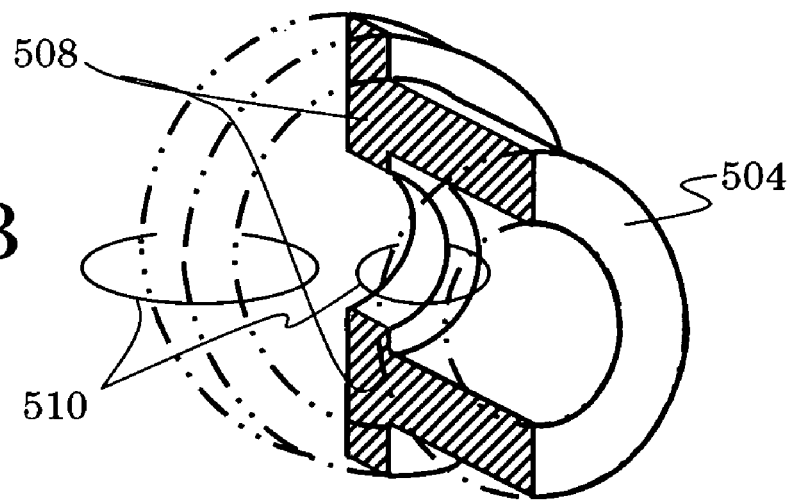
Figure 19A:
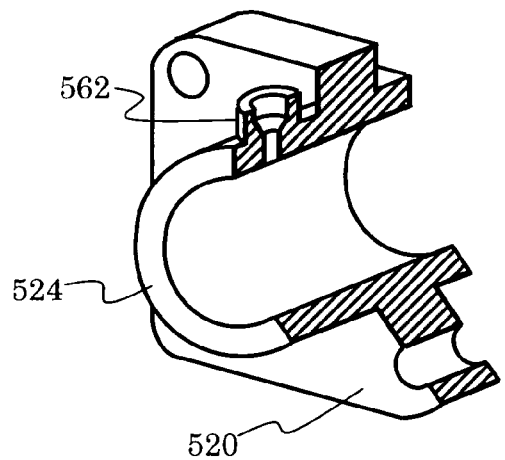
FIGS. 19A to 19C show an example of a sectional view resulting from cutting an object along two crossed planes.
Figure 19B:
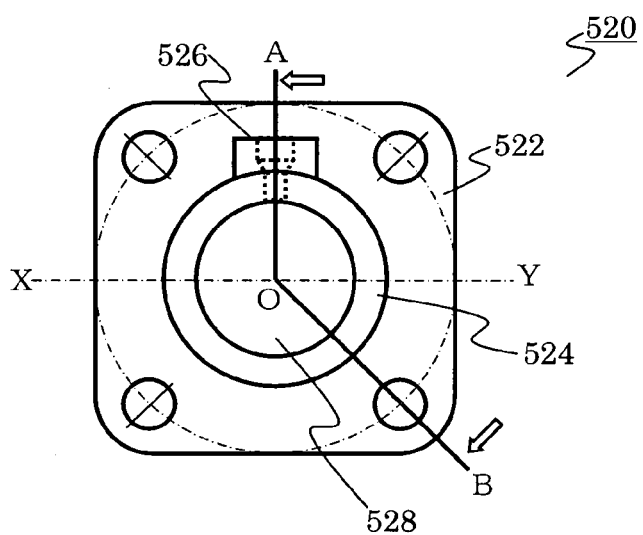
Figure 19C:
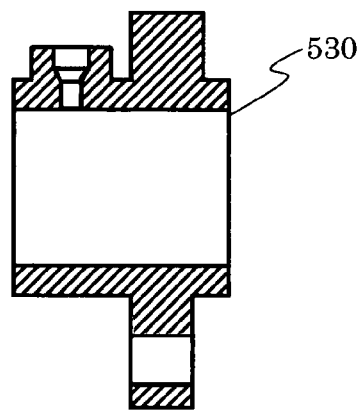

While FIGS. 17B and 17C have been described above as being not displayed on the display, they may also be displayed so that the user can more easily grasp the figures. In such a case, those figures are colored in the same color as the section line to which the section plane corresponds.

As an alternative, the system may automatically color the section line, the section plane, and the sectional view, which correspond to one another, in the same color. When the user designates a color, it is desired to use the designated color. The designation of a color by the user can be made on any of the section line, the section plane, and the sectional view.

Although the present invention has been described above in connection with the embodiments, the technical scope of the present invention is not limited to the scope described in the embodiments, and the embodiments can be modified or improved in various ways. Those modified or improved embodiments are also involved in the technical scope of the present invention. That point is also apparently understood from Claims and Means for Solving the Problems as well.

What is claimed is:

1. A combined sectional view producing method performed by a computer according to a program, comprising:

determining whether a section line to specify a cut face is a linear line, the section line according to information input by a user, on the basis of data input via input means coupled to the computer;

searching for a connected section line, which is connected to a target section line, from a plurality of section lines;

obtaining a crossed point between the searched connected section line and the target section line;

obtaining a section plane, the section plane passing the section line and having the same normal line vector as a normal line vector of the cut face;

obtaining an adjacent section plane, the adjacent section plane being perpendicular to a plane including the plurality of section lines and to the obtained section plane, the adjacent section plane passing the obtained crossed point between the connected section line and the target section line;

obtaining a viewing direction of the target section line, the viewing direction being reversal to the normal line vector of the section plane corresponding to the target section line;

specifying an element and/or a part of an element of a three-dimensional model, which can be seen with a viewing direction set to the viewing direction of the target section line;

specifying an element and/or a part of an element of the three-dimensional model, which is positioned on the side of the section plane opposed to the normal line vector thereof, including the plane itself;

specifying an element and/or a part of an element of the three-dimensional model, which is positioned on the side of the adjacent section plane opposed to the normal line vector thereof;

projecting the elements and/or the parts of the elements which have been specified with respect to visibility in the viewing direction of the target section line, the section plane, and the adjacent section plane, thereby obtaining a sectional view to be combined; and combining a plurality of sectional views to be combined, thereby producing a combined sectional view, the plurality of sectional views including a sectional view which is obtained on the basis of a viewing direction different from the obtained viewing direction.

2. A combined sectional view producing method performed by a computer according to a program, comprising:

determining whether a section line to specify a cut face is a linear line, the section line according to information input by a user, on the basis of data input via input means coupled to the computer;

searching for a connected section line, which is connected to a target section line, from a plurality of section lines;

obtaining a crossed point between the searched connected section line and the target section line;

obtaining a section plane, the section plane passing the section line and having the same normal line vector as a normal line vector of the cut face;

obtaining an adjacent section plane, the adjacent section plane being perpendicular to a plane including the plurality of section lines and to the obtained section plane, the adjacent section plane passing the obtained crossed point between the connected section line and the target section line;

obtaining a viewing direction of the target section line, which is reversal to the normal line vector of the section plane corresponding to the target section line;

specifying an element and/or a part of an element of a three-dimensional model, which is positioned on the side of the section plane opposed to the normal line vector thereof, including the plane itself;

specifying an element and/or a part of an element which belongs to a portion of the three-dimensional model on the side of the section plane opposed to the normal line vector thereof, and which can be seen with a viewing direction set to the viewing direction of the target section line;

specifying one or more of the elements and/or the parts of the elements of the three-dimensional model capable of being seen with the viewing direction set to the viewing direction of the target section line, which are positioned on the side of the adjacent section plane opposed to a normal line vector thereof;

projecting the one or more elements and/or parts of the elements which have been specified with respect to the adjacent section plane, thereby obtaining a sectional view to be combined; and combining a plurality of sectional views to be combined, thereby producing a combined sectional view, the plurality of sectional views including a sectional view which is obtained on the basis of a viewing direction different from the obtained view direction.

3. The combined sectional view producing method according to claim 1 or 2, wherein the specifying an element and/or a part of an element, which is positioned on the side of the adjacent section plane opposed to the normal line vector thereof, specifies the element and/or the part of the element without including the plane itself.

4. The combined sectional view producing method according to claim 1 or 2, wherein if the section line is not a linear line, the processing related to the relevant section line is not executed.

5. The combined sectional view producing method according to claim 1 or 2, wherein the combining the sectional views to be combined, thereby producing a combined sectional view, produces the combined sectional view by combining the sectional views on the basis of a crossed axis between the section planes.

6. The combined sectional view producing method according to claim 1 or 2, further comprising:
- obtaining a first angle formed between a viewing direction of a sectional view according to information input by a user and the viewing direction of the target section line; and
- obtaining a viewing up-direction of the target section line from a viewing up-direction of the sectional view according to information input by the user and the first angle,
- wherein the projecting the elements and/or the parts of the elements, the elements and/or the parts having been specified with respect to visibility in the viewing direction of the target section line, the section plane, and the adjacent section plane, thereby obtaining a sectional view to be combined, wherein a plane specified by the viewing direction and the viewing up-direction of the target section line is a projection plane.

7. The combined sectional view producing method according to claim 1 or 2, wherein the elements and/or the parts of the elements in the produced combined sectional view are colored in different colors for each of the sectional views to be combined.

8. The combined sectional view producing method according to claim 7, wherein the different colors allocated to the respective sectional views to be combined differ from each other depending on colors set related to the corresponding section lines and/or section planes.

9. A combined sectional view producing apparatus comprising:
- means for determining whether a section line to specify a cut face is a linear line, the section line according to information input by a user, on the basis of data input via input means coupled to the apparatus;
- means for searching for a connected section line, which is connected to a target section line, from a plurality of section lines;
- means for obtaining a crossed point between the searched connected section line and the target section line;
- means for obtaining a section plane, the section plane passing the target section line and having the same normal line vector as a normal line vector of a plane, the plane passing the target section line and being perpendicular to a plane including the plurality of section lines;
- means for obtaining an adjacent section plane perpendicular to the plane including the plurality of section lines and to the obtained section plane, the adjacent plane passes the obtained crossed point between the connected section line and the target section line;
- means for obtaining a viewing direction of the target section line, the viewing direction being reversal to the normal line vector of the section plane corresponding to the target section line;
- means for specifying an element and/or a part of an element of a specified three-dimensional model, the element and/or the part being seen with a viewing direction set to the viewing direction of the target section line;
- means for specifying an element and/or a part of an element of the three-dimensional model, which is positioned on the side of the section plane opposed to the normal line vector thereof, including the plane itself;
- means for specifying an element and/or a part of an element of the three-dimensional model, the element and/or the part positioned on the side of the adjacent section plane opposed to the normal line vector thereof;
- means for projecting the elements and/or the parts of the elements which have been specified with respect to visibility in the viewing direction of the target section line, the section plane, and the adjacent section plane, thereby obtaining a sectional view to be combined; and
- means for combining a plurality of sectional views to be combined, thereby producing a combined sectional view, the plurality of sectional views including a sectional view which is obtained on the basis of a viewing direction different from the obtained viewing direction.

10. An information storing medium storing a combined sectional view producing program for operating a computer to function as:
- means for determining whether a section line to specify a cut face is a linear line, the section line according to information input by a user, on the basis of data input via input means coupled to the computer;
- means for searching for a connected section line, the connected section connected to a target section line, from a plurality of section lines;
- means for obtaining a crossed point between the searched connected section line and the target section line;
- means for obtaining a section plane, the section plane passing the target section line and having the same normal line vector as a normal line vector of a plane, the plane passing the target section line and being perpendicular to a plane including the plurality of section lines;
- means for obtaining an adjacent section plane perpendicular to the plane including the plurality of section lines and to the obtained section plane, the adjacent plane passes the obtained crossed point between the connected section line and the target section line;
- means for obtaining a viewing direction of the target section line, the viewing direction being reversal to the normal line vector of the section plane corresponding to the target section line;
- means for specifying an element and/or a part of an element of a specified three-dimensional model, the element and/or the part being seen with a viewing direction set to the viewing direction of the target section line;
- means for specifying an element and/or a part of an element of the three-dimensional model, which is positioned on the side of the section plane opposed to the normal line vector thereof, including the plane itself;
- means for specifying an element and/or a part of an element of the three-dimensional model, the element and/or the part positioned on the side of the adjacent section plane opposed to the normal line vector thereof;
- means for projecting the elements and/or the parts of the elements which have been specified with respect to visibility in the viewing direction of the target section line, the section plane, and the adjacent section plane, thereby obtaining a sectional view to be combined; and
- means for combining a plurality of sectional views to be combined, thereby producing a combined sectional view, the plurality of sectional views including a sectional view which is obtained on the basis of a viewing direction different from the obtained viewing direction.

* * * * *